US012187853B2

(12) United States Patent
Pallem et al.

(10) Patent No.: US 12,187,853 B2
(45) Date of Patent: Jan. 7, 2025

(54) SILICON-BASED SELF-ASSEMBLING MONOLAYER COMPOSITIONS AND SURFACE PREPARATION USING THE SAME

(71) Applicants: American Air Liquide, Inc., Fremont, CA (US); L'Air Liquide, Société Anonyme pour l'Etude et l'Exploitation des Procédés Georges Claude, Paris (FR)

(72) Inventors: Venkateswara R. Pallem, Hockessin, DE (US); Jean-Marc Girard, Versailles (FR); Nicolas Blasco, Grenoble (FR); Claudia Fafard, Newark (DE); Fabrizio Marchegiani, Wilmington, DE (US)

(73) Assignees: L'Air Liquide, Société Anonyme pour l'Etude et l'Exploitation des Procédés Georges Claude, Paris (FR); American Air Liquide, Inc., Fremont, CA (US)

( * ) Notice: Subject to any disclaimer, the term of this patent is extended or adjusted under 35 U.S.C. 154(b) by 196 days.

(21) Appl. No.: 18/009,668

(22) PCT Filed: Jun. 18, 2021

(86) PCT No.: PCT/US2021/037974
§ 371 (c)(1),
(2) Date: Dec. 9, 2022

(87) PCT Pub. No.: WO2021/257927
PCT Pub. Date: Dec. 23, 2021

(65) Prior Publication Data
US 2023/0331926 A1   Oct. 19, 2023

Related U.S. Application Data

(60) Provisional application No. 63/040,833, filed on Jun. 18, 2020.

(51) Int. Cl.
*C08G 77/62* (2006.01)
*C09D 183/16* (2006.01)

(52) U.S. Cl.
CPC ........... *C08G 77/62* (2013.01); *C09D 183/16* (2013.01)

(58) Field of Classification Search
CPC .............................. C08G 77/62; C09D 183/16
See application file for complete search history.

(56) References Cited

U.S. PATENT DOCUMENTS

| 3,549,368 A | 12/1970 | Collins et al. |
| 3,596,370 A | 8/1971 | Gabrail |

(Continued)

FOREIGN PATENT DOCUMENTS

| EP | 1 724 373 | 11/2006 |
| JP | H01 143221 | 6/1989 |

(Continued)

OTHER PUBLICATIONS

Arkles, B., Hydrophobicity, hydrophilicity and silane surface modification, downloaded from URL https://www.gelest.com/wp-content/uploads, Jun. 18, 2021.

(Continued)

*Primary Examiner* — Nathan H Empie
(74) *Attorney, Agent, or Firm* — Yan Jiang

(57) ABSTRACT

Disclosed is a SAM forming composition comprising a SAM monomer or precursor having a backbone with a surface reactive group, wherein the backbone contains no Si—C bonds and is selected from the group consisting of a Si—C bond-free polysilane and a trisilylamine. The surface reactive groups are disclosed for the surface to be covered being a dielectric surface and a metal surface, respectively. A process of forming a SAM on a surface and a process of forming a film on the SAM are also disclosed.

12 Claims, 6 Drawing Sheets

(56) References Cited

U.S. PATENT DOCUMENTS

| | | |
|---|---|---|
| 4,181,751 A | 1/1980 | Hall et al. |
| 4,592,132 A | 6/1986 | Lee et al. |
| 4,597,003 A | 6/1986 | Aine et al. |
| 5,204,141 A | 4/1993 | Roberts et al. |
| 5,362,559 A | 11/1994 | Hayase et al. |
| 5,632,868 A | 5/1997 | Harada et al. |
| 5,728,602 A | 3/1998 | Bellows et al. |
| 5,874,368 A | 2/1999 | Laxman et al. |
| 6,087,262 A | 7/2000 | Yang et al. |
| 6,100,579 A | 8/2000 | Sonoda et al. |
| 6,248,397 B1 | 6/2001 | Ye |
| 6,358,863 B1 | 3/2002 | Desu et al. |
| 6,391,803 B1 | 5/2002 | Kim et al. |
| 6,531,412 B2 | 3/2003 | Conti et al. |
| 6,797,559 B2 | 9/2004 | Lee et al. |
| 6,818,250 B2 | 11/2004 | George et al. |
| 6,930,061 B2 | 8/2005 | Cheung et al. |
| 7,875,312 B2 | 1/2011 | Thridandam et al. |
| 8,460,753 B2 | 6/2013 | Xiao et al. |
| 8,669,387 B2 | 3/2014 | Miller |
| 9,117,664 B2 | 8/2015 | Zhou |
| 9,233,990 B2 | 1/2016 | Xiao et al. |
| 9,460,912 B2 | 10/2016 | Chandra et al. |
| 10,494,387 B2 | 12/2019 | Sanchez et al. |
| 2001/0000476 A1 | 4/2001 | Xia et al. |
| 2002/0000202 A1 | 1/2002 | Yuda et al. |
| 2002/0018849 A1 | 2/2002 | George et al. |
| 2002/0052124 A1 | 5/2002 | Raaijmakers et al. |
| 2002/0076944 A1 | 6/2002 | Wang et al. |
| 2002/0175393 A1 | 11/2002 | Baum et al. |
| 2003/0183244 A1 | 10/2003 | Rossman |
| 2004/0018694 A1 | 1/2004 | Lee et al. |
| 2004/0040501 A1 | 3/2004 | Baartstra |
| 2004/0168627 A1 | 9/2004 | Conley, Jr. et al. |
| 2004/0197474 A1 | 10/2004 | Vrtis et al. |
| 2004/0198069 A1 | 10/2004 | Metzner et al. |
| 2004/0209005 A1 | 10/2004 | Goto et al. |
| 2005/0048204 A1 | 3/2005 | Dussarrat et al. |
| 2005/0116266 A1 | 6/2005 | Hirano |
| 2005/0139937 A1 | 6/2005 | Kamiyama et al. |
| 2005/0142716 A1 | 6/2005 | Nakajima et al. |
| 2005/0255246 A1 | 11/2005 | Kim et al. |
| 2005/0260420 A1 | 11/2005 | Collins et al. |
| 2006/0032442 A1* | 2/2006 | Hasebe ............... C03C 17/245 427/248.1 |
| 2006/0062917 A1 | 3/2006 | Muthukrishnan et al. |
| 2006/0178019 A1 | 8/2006 | Senzaki et al. |
| 2006/0221829 A1 | 10/2006 | Holmstrom et al. |
| 2006/0286818 A1 | 12/2006 | Wang et al. |
| 2007/0010072 A1 | 1/2007 | Bailey et al. |
| 2007/0059491 A1 | 3/2007 | Kawashima et al. |
| 2007/0129331 A1 | 6/2007 | Gately et al. |
| 2007/0160774 A1 | 7/2007 | Tsukada et al. |
| 2007/0281495 A1 | 12/2007 | Mallick et al. |
| 2008/0081104 A1 | 4/2008 | Hasebe et al. |
| 2008/0207007 A1 | 8/2008 | Thridandam et al. |
| 2009/0075490 A1 | 3/2009 | Dussarrat |
| 2009/0130414 A1 | 5/2009 | Kim et al. |
| 2009/0232985 A1 | 9/2009 | Dussarrat et al. |
| 2010/0255218 A1 | 10/2010 | Oka et al. |
| 2010/0291321 A1 | 11/2010 | Mallikarjunan et al. |
| 2011/0130584 A1 | 6/2011 | Ohno et al. |
| 2011/0195582 A1 | 8/2011 | Zhou |
| 2011/0313184 A1 | 12/2011 | Tajima et al. |
| 2013/0157877 A1* | 6/2013 | Plenat ............... C12Q 1/6876 506/7 |
| 2013/0217241 A1 | 8/2013 | Underwood et al. |
| 2015/0004317 A1 | 1/2015 | Dussarrat et al. |
| 2015/0094470 A1* | 4/2015 | Sanchez ............ H01L 21/02617 548/950 |
| 2015/0299848 A1 | 10/2015 | Haukka et al. |
| 2016/0225616 A1 | 8/2016 | Li et al. |
| 2016/0307747 A1 | 10/2016 | Shestopalov et al. |
| 2017/0207082 A1 | 7/2017 | Wang et al. |
| 2017/0335449 A1 | 11/2017 | Li et al. |
| 2018/0294152 A1 | 10/2018 | Xiao et al. |

FOREIGN PATENT DOCUMENTS

| | | |
|---|---|---|
| JP | H05 175132 | 7/1993 |
| JP | H06 132276 | 5/1994 |
| JP | H06 132284 | 5/1994 |
| JP | 2002 093803 | 3/2002 |
| JP | 2002 093804 | 3/2002 |
| JP | 2003 188171 | 7/2003 |
| JP | 2004 017591 | 1/2004 |
| JP | 2004 165668 | 6/2004 |
| JP | 2004 193710 | 6/2004 |
| JP | 2004 214304 | 7/2004 |
| JP | 2005 026244 | 1/2005 |
| JP | 2005 080628 | 3/2005 |
| JP | 2011 210881 | 10/2011 |
| KR | 10 2009 7019562 | 1/2011 |
| KR | 10 1380317 | 3/2014 |
| TW | 201630726 | 9/2016 |
| WO | WO 01 66832 | 9/2001 |
| WO | WO 02 027063 | 4/2002 |
| WO | WO 03 046254 | 6/2003 |
| WO | WO 2004 017378 | 2/2004 |
| WO | WO 2004 017383 | 2/2004 |
| WO | WO 2004 092441 | 10/2004 |
| WO | WO 2005 080628 | 9/2005 |
| WO | WO 2005 093126 | 10/2005 |
| WO | WO 2006 097525 | 9/2006 |
| WO | WO 2006 136584 | 12/2006 |
| WO | WO 2007 002040 | 1/2007 |
| WO | WO 2009 039251 | 3/2009 |
| WO | WO 2009 087609 | 7/2009 |
| WO | WO 2011 031591 | 3/2011 |
| WO | WO 2011 123792 | 10/2011 |
| WO | WO 2018 063907 | 4/2018 |
| WO | WO 2020 033698 | 2/2020 |

OTHER PUBLICATIONS

Bartholomew, L. et al., "Comparison of ALD of $HfO_2$, $SiO_2$, and $Hf_xSi_{1-x}O_2$ thin films using various metal-silicon alkylamide precursors and $O_3$," ECS Transactions, 3 (15) 37-49 (2007).

Besancon, B. et al., "Comparison of HfSiOx thin film deposited by ALD with moisture using different silicon sources," Abstract #1546, 218$^{th}$ ECS Meeting, Las Vegas, Nevada, 2010.

Brauer, D.J. et al., Tris(trimethylsilylamino)silanes $RSi(NHSiMe_3)_3$. Synthesis, crystal and molecular structure of three dimeric trilithio derivatives, J. Organometallic Chemistry, 287 (1985), 305-320.

Chen, C.W. et al., "Investigation of the electrical properties and reliability of amorphous SiCN," Thin Solid Films 447-448 (2004) 632-637.

Cheng, Y.- L. et al., "Comprehensive comparison of electrical and reliability characteristics of various copper barrier films," Journal of Vacuum Science & Technology B, Nanotechnology and Microelectronics: Materials, Processing, Measurement, and Phenomena 29, 031207 (2011).

Dussarrat, C. et al., "Trisilylamine: A C & Cl-free solution for low temperature silicon nitride chemical vapor deposition," MRS Spring Meeting 2003, Symposium D, CMOS Front-End Materials and Process Technology, Apr. 22-24, 2003, p. 94.

Ebata, K. et al., Synthesis and characterization of end-grafted polysilane on a substrate surface, J. Am. Chem. Soc. 1998, 120, 7367-7368.

Fainer, N. et al., "Low-k dielectrics on base of silicon carbon nitride films, "Surface & Coatings Technology 201 (2007) 9269-9274.

Ferguson J.D., et al. "ALD of $SiO_2$ at room temperature using TEOS and $H_2O$ with $NH_3$ as the catalyst." J. Electrochemical Society, vol. 151, No. 8, Aug. 2004, pp. G528-G535.

Furukawa, K. et al., Polysilane bearing 'sulfide tripod' terminus : preparation and selective chemisorption on gold surface, Macromolecules 2003, 36, 9-11.

(56) References Cited

OTHER PUBLICATIONS

Jousseaume, V. et al., "Mechanical stress in PECVD a-SiC:H: aging and plasma treatments effects," Materials Science in Semiconductor Processing 7 (2004) 301-305.
Kamiyama, S. et al., "Atomic layer deposition of hafnium silicate gate dielectric films using $Hf[N(CH_3)(C_2H_5)]_4$ and $SiH[N(CH_3)_2)_3]$ precursors," Electrochemical and Solid-State Letters, 8 (8) pp. G215-G2127 (2005).
Kamiyama, S. et al., "Comparison between Hf-silicate films deposited by ALD with BDMAS $[SiH_2(N(CH_3)_2]_2$ and TDMAS $[SiH(N(CH_3)_2)_3]$ precursors," Electrochemical and Solid-State Letters, 8 (10) pp. F37-F39 (2005).
Kamiyama, S. et al., "Comparison of the electrical properties of poly-Si/Hf-silicate gate stacks fabricated by ALD employing BDMAS and TDMAS precursors," Journal of The Electrochemical Society, 2006, 153(3), pp. G187-G191.
Klaus, J.W. et al., "$SiO_2$ chemical vapor deposition at room temperature using $SiCl_4$ and $H_2O$ with an NH 3 catalyst," J. Electrochemical Society 2000 147 (7) 2658-2664.
Kukli, K. et al., "Atomic layer deposition of hafnium dioxide films from 1-methoxy-2-methyl-2-propanolate complex of hafnium," Chem. Mater. 2003 15 1722-1727.
Leskela, M. et al., "Atomic layer deposition (ALD): from precursors to thin film structures," Thin Solid Films 409 (2002) 138-146.
Leskela, M et al., "Atomic layer deposition chemistry: recent developments and future challenges," Angew. Chem. Int. Ed. 2003 5548-5554.
Lim, J-W et al., "Low-temperature growth of $SiO_2$ films by plasma-enhanced atomic layer deposition," ETRI Journal, vol. 27, No. 1, Feb. 2005, pp. 118-121.
Lisker, M. et al., "Sub-atmospheric chemical vapor deposition of $SiO_2$ for dielectric layers in high aspect ratio TSVs," Abstract, Silicon Compatible Materials, Processes, and Technologies for Advanced Integrated Circuits and Emerging Applications—219th ECS Meeting, Montreal, QC, Canada, May 1-6, 2011, 1 pg.
Mallikarjunan, A. et al., "Silicon precursor development for advanced dielectric barriers for VLSI technology," Microelectronic Engineering (2011) doi: 10 1016/j mec 2011.04.014.
Morosanu, C.E., "Thin films by chemical vapour deposition," 1990 Elsevier B.V., publisher, ISBN: 978-0-444-98801-0,pp. 50, 83, and 347.
Nakayama, H. et al., "Super $H_2O$-barrier film using Cat-CVD (HWCVD)-grown SiCN for film-based electronics," Thin Solid Films 519 (2011), 4483-4486.
Nanmat, "ALD/CVD precursors value-added materials supply," NANMAT Technologies Co., downloaded from http://www.nanomatetech.com/Download/NanmatTechnology-Precursor-2011-06.pdf on Oct. 26, 2011.
O'Neill, M.L. et al., "Impact of aminosilane precursor structure on silicon oxides by atomic layer deposition," The Electrochemical Society Interface, Winter 2011, pp. 33-37.
Remiat, B. et al., "Copper-barrier and hard-mask elaboration by plasma-enhanced chemical vapor deposition using organosilane precursors," Electrochemical society Proceedings vol. 2003-13 14-19.
Schreiber, F., Structure and growth of self-assembling monolayers, Progress in Surface Sciences 65 (2000), 151-256.
Shimizu, H. et al., "Novel precursors for SiCH low-k caps beyond the 22nm node: reactions of silacyclopentane precursors in the plasma-enhanced chemical vapor deposition process and structural analyses of SiCH films, "Japanese Journal of Applied Physics 50 (2011) 08KA01-1-08KA01-9.
Van Besien, E. et al., "Influence of porosity on electrical properties of low-k dielectrics," Microelectronic Engineering 92 (2012) 59-61.
Wang, L. et al., Surface chemical reactions on self-assembled silane based monolayers, Chem. Soc, Roy. 2021, 34 pages.
Widmann, D. "Technologie hochintegrierter Schaltungen, 2. Auflage." 1996, Springer Verlag, pp. 13-21, pp. 62-64.
U.S. Appl. No. 11/917,924, filed Dec. 18, 2007.
U.S. Appl. No. 12/233,057, filed Sep. 18, 2008.
Hungarian Search Report and Written Opinion for related Singapore application No. SG 201001880-2, Jul. 15, 2011.
Australian Search Report and Written Opinion for related Singapore application No. SG 200706801-8, Oct. 30, 2008.
International Search Report and Written Opinion for related PCT/EP2006/060829, Aug. 31, 2006.
International Search Report and Written Opinion for related PCT/EP2006/063414, Oct. 19, 2006.
International Search Report and Written Opinion for related PCT/US2008/076810, Dec. 16, 2008.
International Search Report and Written Opinion for related PCT/US2012/072051, Apr. 24, 2013.
Taiwan Search Report and Written Opinion for related TW 09518926, Jun. 4, 2013.
International Search Report and Written Opinion for corresponding PCT/US2019/066333, Mar. 24, 2020.
International Search Report and Written Opinion for corresponding PCT/US2021/037974, Sep. 7, 2021.

* cited by examiner

SILICON-BASED SELF-ASSEMBLING MONOLAYER COMPOSITIONS AND SURFACE PREPARATION USING THE SAME

CROSS REFERENCE TO RELATED APPLICATIONS

This application is a 371 of International PCT Application PCT/US2021/037974, filed Jun. 18, 2021, which claims priority to U.S. Provisional Patent Application No. 63/040,833, filed Jun. 18, 2020, the entire contents of each being incorporated herein by reference.

TECHNICAL FIELD

The present invention relates to self-assembling monolayer (SAM) monomers or precursors having a Si-based tail or backbone (SiT-SAM) that contains no Si—C bonds, their syntheses, and their applications in surface preparations in film forming processes, in particular, to the SiT-SAM monomers selected from the group consisting of Si—C-free polysilane-based tail SiT-SAMs monomers and trisilylamine-based tail SiT-SAMs monomers.

BACKGROUND

Self-assembled monolayers (SAMs) have been extensively studied and used due to their capacity for controlling surface properties such as wettability, corrosion resistance, and for their applications in electronic device fabrications. SAM refers to the coverage of a surface by an array of molecules, hereafter the array of molecules refers to as SAM monomers or precursors. Molecules capable of forming SAMs include surface reactive head groups, which have a reactive side and bind to the surface of a substrate, functional tail groups or backbones, which are inert to the surface and usually exposed at SAM surfaces and can be used to tailor the chemical and physical properties of the surface. Provided the density of sites that are reactive with the SAM Monomer head, and that appropriate conditions are used to have the monomer head and such site react, the exposure of the surface to SAM monomer leads to the formation of a SAM monolayer. When the SAM monomers have long tails, they eventually self-align into a grass-like structure. An overview of SAM chemistry and application may be found in the following review document: Frank Schreiber, "Structure and growth of self-assembling monolayers"; Progress in Surface Science 65 (2000) 151-256.

The SAM monomer head contains a chemical function design to selectively react and attach to specific surfaces and substrates. The most common SAM heads/chemical functionalities and the respective surface that the SAM heads/chemical functionalities react with, are summarized in Table 1 below:

TABLE 1

Most common SAM monomer head groups

| SAM monomer heads | Chemical functional groups | Surfaces | Remarks |
| --- | --- | --- | --- |
| Tail-SH | Thiol | Metallic (Cu, Co, Si) | The SAM monomer may be bi-functional |
| Tail-P(=O)(OH)$_2$ | Phosphonic acids | Metallic (Cu, Co, Ni) | The SAM monomer may be bi-functional |
| Tail-C(=O)(OH) | Carboxylic acids | Metallic (Cu, Co, Ni . . .) | The SAM monomer may be bi-functional |
| Tail-SiH$_3$ | Tris-hydridosilane | Crystalline Si, precious metals | |
| Tail-CH=CH$_2$ | Alkene | Metallic surfaces (Au, Ni, Pt, Pd, Ru . . .) | |
| Tail-SiX$_3$* | Silyl (tris functional) | OH terminated surfaces (e.g., SiO$_2$, metal oxides) | |
| Tail-SiRX$_2$* | Silyl (bis-functional) | OH terminated surfaces (e.g., SiO$_2$, metal oxides) | R is typically —CH$_3$ or a short chain alkyl |
| Tail-SiR$_2$X* | Silyl (mono-functional) | OH terminated surfaces (e.g., SiO=, metal oxides) | R is typically —CH$_3$ or a short chain alkyl |
| Tail-C(=O)—NH—R | Acetamide | OH terminated surfaces (e.g., SiO$_2$, metal oxides) | R is typically a short chain alkyl, and the tail may be as defined below or a trialkylsilyl. |

*X is an —OH reactive group such as a halide (Cl, Br, I), an isocyanate, an alkylamino group —NR$^1$R$^2$, wherein R$^1$ and R$^2$ are each independently selected from H, a C$_1$ to C$_{10}$ linear, branched or cyclic alkyl or alkenyl, a trialkylsilyl, provided that if R$^1$ = H, R$^2$ is larger than C$_1$.

The SAM monomer tail usually consists of a —(CH$_2$)$_n$—CH$_3$ alkyl chain, with n ranging from 0 to approximately 20. However, the tail may contain additional functions/chemical groups, and may be represented as: —(CH$_2$)$_n$—X, with n=1 to 20, and X being a specific chemical group that will provide secondary reactivity of the SAM on the surface. For instance, X may be an amino group, an alkoxy group, an epoxy group, and an unsaturated group like —CH=CH$_2$, —C≡CH, or Phenyl. The SAM tail group may also contain a perfluoroalkyl group and have a general formula of: —(CH$_2$)$_n$—(CF$_2$)$_m$—CF$_3$, with n=0 to 5, and m=0 to 16. The addition of a perfluorinated chain contributes to increasing the hygrophobic power of the SAM coated surface.

Very few SAMs having Si containing tails have been described, and are limited to the following references. K.

Ebata, et al. ("Synthesis and Characterization of End-Grafted Polysilane on a Substrate Surface", *J. Am. Chem. Soc.* 1998, 120, 7367-7368) disclose a Si moiety is grafted on a classical SAM tail, and the "Si$_2$" moiety is fully alkylated.

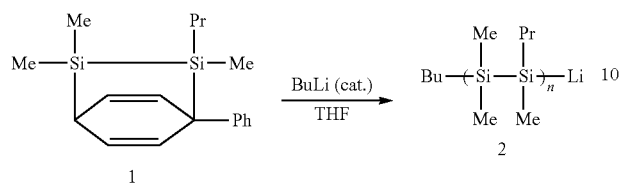

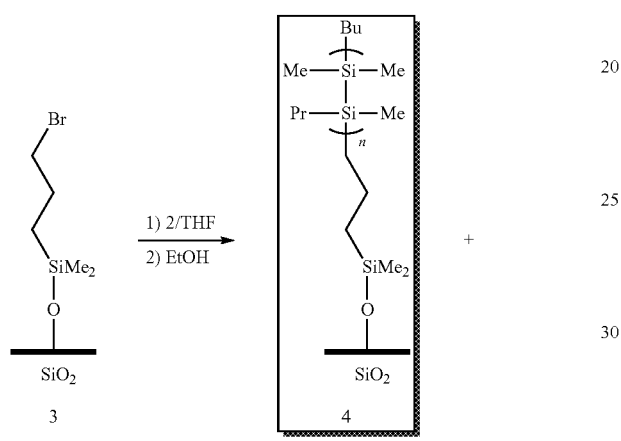

K. Furukawa et al. ("Polysilane Bearing "Sulfide Tripod" Terminus: Preparation and Selective Chemisorption on Gold Surface", Macromolecules, 2003, 36, 9-11) discloses the SAM is designed to attach to a metal surface with a tri-thiol head group, and the tail is functionalized by an alkylated Si$_2$ moiety.

Chart 1. Synthesis Route of Polysilane Bearing Sulfide Tripod Terminus

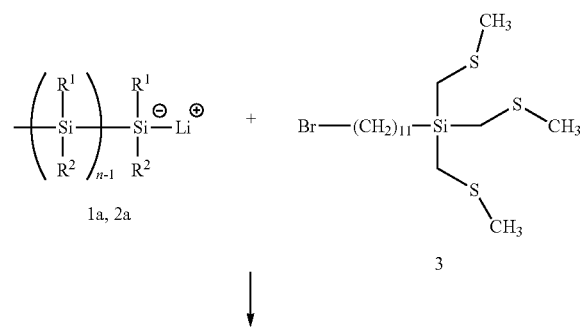

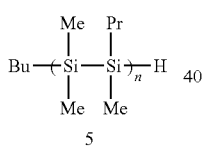

SAMs find applications and industrial usages in surface treatments to increase the adhesion of a surface to another surface (i.e., coupling agents), or to modify the affinity to certain fluids such as water. SAMs having alkyl chains are designed and used to decrease the affinity to polar molecules (typically water) but also to increase the affinity to non-polar molecule and fluids. Multiple surface treatments to increase the hydrophobicity of glass for instance are based on treatment using SAMs having a tri-functional silyl head group and an alkyl chain tail. A monograph on the subject can be found here: https://www.gelest.com/wp-content/uploads/Hydrophobicity-Hydrophilicity_and_Silane_Surface_Modification.pdf.

SAMs may be built on a surface essentially by two routes:
i) A wet route, in which the surface to be treated is exposed to the SAM monomer or a solution of the SAM monomer in a solvent. Such methods include dip coating, slit coating, spin coating, spray coating, etc. The substrate is then normally rinsed with a solvent that will remove the excess SAM monomer on the surface, which have not chemically reacted with the surface active sites. The exposure to the SAM monomer in the liquid phase may span from seconds to days, depending on the type of SAM monomer.
ii) A gas phase route, in which the surface to be treated is exposed to and left to react with vapors of the SAM monomers. In such instances, the substrate is usually heated above room temperature but below the decomposition temperature of the SAM monomer on the surface to promote and accelerate the reaction and attachment of the SAM monomers to the surface. This reaction may be realized at atmospheric pressure or under vacuum. The usage of a gas phase route requires the SAM monomer to be volatile enough to be evaporated and reach a sufficient vapor pressure to react with the surface within a reasonable time.

In the semiconductor industry, SAM surface treatments are used to prepare silicon substrates for the deposition of an organic photoresist layer by a pretreatment in a silylating agent such as HMDS (Me$_3$Si—NH—SiMe$_3$), which is a short chain mon-functional SAM monomer that leaves a MeSi—O— terminated surface upon reaction with an —OH terminated surface. HMDS was first described in U.S. Pat. No. 3,549,368 by R. H. Collins and F. T. Devers of IBM (1970) as a photoresist adhesion promoter for semiconductor applications. The trialkyl-silylation of the surface contributes to increasing the wettability of the surface to the photoresist formulation, thus increasing the adhesion, uniformity of the film and limiting defects such as voids or microbubbles.

Similarly, the usage of surface alkyl-silylation is common before the deposition by various coating method of film forming formulations such as spin on dielectrics (SOD).

SAMs have recently attracted attention for thin film selective deposition using atomic layer deposition (ALD) technique, i.e. Selective Area Atomic Layer Deposition (AS-ALD). In fact, being able to selectively deposit thin films on certain areas of a substrate and not on others in a controlled fashion holds promises to reduce the complexity and cost of chip manufacturing. The usage of SAMs is now proliferating as a viable solution to enable AS-ALD by blocking selected surface from reacting with the precursor during the ALD cycle, and thereby growing the film selectively on the non-SAM covered areas.

As such, the usage of SAMs is becoming increasingly common in film forming processes, either as a wettability enhancer for liquid-based film forming formation, or as a surface blocking agent for gas-phase deposition processes, but potentially for liquid phase as well.

However, in all the cases described above, the tail of the SAM monomer is based on a carbon backbone. Considering the fact that carbon may be a detrimental impurity in certain thin film applications, and that the tail is chemically attached to the surface, it would be beneficial to have SAM monomers that are not based on a carbon backbone. Further, SAM monomers that are not based on carbon backbones could also be used for additional applications such as seed layers to enhance nucleation of CVD and ALD processes, due to their increased reactivity to specific chemical families, metal halides for example.

Thus, a need remains for finding new SAM monomers having a non-carbon backbone, which may enhance nucleation of CVD and ALD processes.

SUMMARY

Disclosed are self-assembling monolayer (SAM) forming compositions for forming SAMs, the composition comprising a SAM precursor having a backbone with a surface reactive group X, wherein the backbone contains no Si—C bonds and is selected from the group consisting of a Si—C bond-free polysilane and a trisilylamine (TSA), wherein the surface reactive group X is selected from:
  a. a halide (Cl, Br, I);
  b. a cyanate, an isocyanate or a thiocyanate group;
  c. an amino group —NR$^1$R$^2$, wherein R$^1$ is selected from H, a linear, branched or cyclic $C_1$-$C_{10}$ alkyl or alkenyl group or an alkyl silyl group; R$^2$ is selected from a linear, branched or cyclic $C_2$-$C_{10}$ alkyl or alkenyl group, or an alkyl silyl group; or R$^1$ and R$^2$ are bridged so that NR$^1$R$^2$ forms a cyclic ligand, provided that the cyclic ligand includes heteroatoms S, N or O;
  d. an amidinate group —R$^3$—N—C(R$^4$)=N—R$^5$, wherein R$^3$ and R$^5$ are each independently selected from a $C_1$ to $C_{10}$ linear or branched alkyl or a trialkylsilyl; and R$^4$ is selected from H, a $C_1$ to $C_{10}$ linear or branched alkyl; or
  e. a thiol —SH group, a phosphonic acid or a carboxylic acid. The disclosed methods may include one or more of the following aspects:

X being a halide, such as Cl, Br, or I;
X being a cyanate group;
X being an isocyanate;
X being a thiocyanate group;
X being a dialkylamino group —NR$^1$R$^2$, wherein R$^1$ is H, a $C_2$ to $C_5$ alkyl, and R$^2$ is a $C_1$ to $C_5$ alkyl, provided that if R$^1$=H, R$^2$ is $C_3$ to $C_5$ alkyl, and if R$^1$ not H, R$^1$ and R$^2$ are preferably identical;

X being an amidinate group —NR$^3$—C(R$^4$)=N—R$^5$ wherein R$^3$ and R$^5$ are each independently selected from Et, nPr, iPr, nBu, tBu, sBu, iBu; and R$^4$ is H or Me;

the backbone contains no Si—C bonds and is selected from the group consisting of a Si—C bond-free polysilane and a trisilylamine, X being a thiol —SH group;
X being a phosphonic acid;
X being a carboxylic acid;
the surface to be covered being a dielectric surface;
the surface to be covered being a metal;
the backbone containing no Si—C bonds;
the backbone being a Si—C bond-free polysilane;
the backbone being a trisilylamine;
the SAM precursor having the Si—C-free polysilane backbone being selected from
  X—(SiH$_2$)$_n$—SiH$_3$, wherein n=1 to 3,
  X—(Si$_n$H$_{2n}$), wherein Si$_n$H$_{2n}$ refers to a cyclic hydridosilane backbone with n=5, 6, 7,
  X—(SiH(SiH$_3$)$_2$), or
  X—SiH$_2$—Si(SiH$_3$)$_3$,
the SAM precursor having the Si—C-free polysilane backbone being selected from
  X—(SiH$_2$)$_n$—SiH$_3$, wherein n=1 to 3;
the SAM precursor having the Si—C-free polysilane backbone being selected from
  X—(Si$_n$H$_{2n}$), wherein Si$_n$H$_{2n}$ refers to a cyclic hydridosilane backbone with n=5, 6, 7;
the SAM precursor having the Si—C-free polysilane backbone being selected from
  X—(SiH(SiH$_3$)$_2$);
the SAM precursor having the Si—C-free polysilane backbone being selected from
  X—SiH$_2$—Si(SiH$_3$)$_3$;
the SAM precursor having the Si—C-free polysilane backbone being selected from NiPr$_2$—(SiH$_2$)—SiH$_3$, NnBu$_2$-(SiH$_2$)—SiH$_3$, NtBu$_2$-(SiH$_2$)—SiH$_3$, NsBu$_2$-(SiH$_2$)—SiH$_3$, NiBu$_2$-(SiH$_2$)—SiH$_3$, NPen$_2$-(SiH$_2$)—SiH$_3$, NnPr$_2$—(SiH$_2$)$_2$—SiH$_3$, NiPr$_2$—(SiH$_2$)$_2$—SiH$_3$, NnBu$_2$-(SiH$_2$)$_2$—SiH$_3$, NtBu$_2$-(SiH$_2$)$_2$—SiH$_3$, NsBu$_2$-(SiH$_2$)$_2$—SiH$_3$, NiBu$_2$-(SiH$_2$)$_2$—SiH$_3$, NsPen$_2$-(SiH$_2$)$_2$—SiH$_3$, NHtBu-(SiH$_2$)$_2$—SiH$_3$, NHPen-(SiH$_2$)$_2$—SiH$_3$, NHsBu-(SiH$_2$)$_2$—SiH$_3$, NHiBu-(SiH$_2$)$_2$—SiH$_3$, NnPr$_2$—(SiH$_2$)$_3$—SiH$_3$, NiPr$_2$—(SiH$_2$)$_3$—SiH$_3$, NnBu$_2$-(SiH$_2$)$_3$—SiH$_3$, NtBu$_2$-(SiH$_2$)$_3$—SiH$_3$, NsBu$_2$-(SiH$_2$)$_3$—SiH$_3$, NiBu$_2$-(SiH$_2$)$_3$—SiH$_3$, NsPen$_2$-(SiH$_2$)$_3$—SiH$_3$, NEt$_2$-(SiH(SiH$_3$)$_2$), NiPr$_2$—(SiH(SiH$_3$)$_2$), NnPr$_2$—(SiH(SiH$_3$)$_2$), NiBu$_2$-(SiH(SiH$_3$)$_2$), NtBu$_2$-(SiH(SiH$_3$)$_2$), NnBu$_2$-(SiH(SiH$_3$)$_2$), NsBu$_2$-(SiH(SiH$_3$)$_2$), NsPen$_2$-(SiH(SiH$_3$)$_2$), NHtBu-(SiH(SiH$_3$)$_2$), NHnBu-(SiH(SiH$_3$)$_2$), NHiBu-(SiH(SiH$_3$)$_2$), or NHPen-(SiH(SiH$_3$)$_2$);

the Si—C-free polysilane backbone of the SAM precursor being selected from —SiH$_2$—SiH$_3$ or —SiH$_2$—SiH$_2$—SiH$_3$;

the SAM precursor having the trisilylamine backbone having a general formula

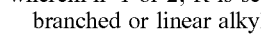

$XR_2Si-N(SiR_3)_n(SiX'R_3)_{2-n}$, wherein n=1 or 2; R is selected from H or a $C_1$ to $C_6$ branched or linear alkyl; X' has the same definition as X and is independent from X;

the SAM precursor having the trisilylamine backbone being $XH_2Si\text{—}N(SiH_3)_n(SiX'H_3)_{2-n}$ or $XR_2Si\text{—}N(SiR_3)_2$;

the SAM precursor having the trisilylamine backbone containing more than one $N(\text{—}Si)_3$ units and having backbones of $(Si)_2N\text{—}Si\text{—}N(Si)Si\text{—}X$ or $X\text{—}Si\text{—}N(Si)\text{—}Si\text{—}N(Si)Si\text{—}X$;

the SAM precursor being $TSA\text{-}N(CHMe_2)_2$;

the SAM precursor being TSA-Cl;

the SAM precursor being $(R^1R^2N)_{n1}(R^3R^4N)_{n2}Si_mH_{(2(m+1)-n1-n2)}$, where n=1 to (2(m+1); m=2 to 6; $R^1$ and $R^2$ are each independently selected from the group consisting of linear or branched $C_1$ to $C_6$ alkyl, linear or branched $C_1$ to $C_8$ alkenyl, linear or branched $C_1$ to $C_6$ alkynyl, $C_6$ to $C_{10}$ aryl, linear or branched $C_1$ to $C_6$ alkyl ether, silyl, trimethyl silyl, or linear or branched $C_1$ to $C_6$ alkyl-substituted silyl;

the SAM precursor being $(R^1HN(CR^3)\!=\!NR^2)_n\text{—}Si_mH_{(2(m+1)-n))}$, where n=1 to (2(m+1); m=2 to 6; $R^1$ and $R^2$ are each independently selected from the group consisting of linear or branched $C_1$ to $C_6$ alkyl, linear or branched $C_1$ to $C_8$ alkenyl, linear or branched $C_1$ to $C_8$ alkynyl, $C_6$ to $C_{10}$ aryl, linear or branched $C_1$ to $C_6$ alkyl ether, silyl, trimethyl silyl, or linear or branched $C_1$ to $C_6$ alkyl-substituted silyl;

the SAM precursor being BDSASi-X, wherein BDSASi—=$(SiH_3)_2N\text{—}SiH_2\text{—}N(SiH_3)(SiH_2\text{—})$, X=F, Cl, Br, I;

the SAM precursor being DIBATS (Diisobutylaminotrisilane);

the SAM precursor being NPS-AMD (NPS being neopentasilane);

the SAM precursor being $NPS\text{—}NR^4R^5$, wherein $R^4$ and $R^5$ are each independently H, linear or branched $C_1$ to $C_6$ alkyl, linear or branched $C_1$ to $C_8$ alkenyl, linear or branched $C_1$ to $C_8$ alkynyl, $C_6$ to $C_{10}$ aryl, linear or branched $C_1$ to $C_6$ alkyl;

the SAM precursor being CHS-AMD (CHS being cyclohexasilane);

the SAM precursor being $CHS\text{—}NR^4R^5$, wherein $R^4$ and $R^5$ are each independently H, linear or branched $C_1$ to $C_6$ alkyl, linear or branched $C_1$ to $C_8$ alkenyl, linear or branched $C_1$ to $C_8$ alkynyl, $C_6$ to $C_{10}$ aryl, linear or branched $C_1$ to $C_6$ alkyl;

The SAM precursor being $Si_3H_7\text{—}NR_2$, wherein $R^{1'}$ is a linear or branched $C_2$ to 05 alkyl;

The SAM precursor being $Si_3H_8N\text{—}NR_2$, wherein $R^1$ is a linear or branched $C_2$ to $C_5$ alkyl;

The SAM precursor containing less than 5% v/v of any of its undesired congeneric species, reactants, or other reaction products;

The SAM precursor containing less than 1% v/v, more preferably less than 0.1% v/v of its undesired congeneric species, reactants, or other reaction products;

The SAM precursor containing less than 0.1% v/v of any of its undesired congeneric species, reactants, or other reaction products;

The SAM precursor containing less than 0.01% v/v of any of its undesired congeneric species, reactants, or other reaction products;

The SAM precursor containing between 5% v/v and 50% v/v of one or more of congeneric monomers, or other reaction products, particularly when the mixture provides improved process parameters or isolation of the target compound is too difficult or expensive;

The SAM precursor containing between approximately 0 ppbw and approximately 500 ppbw metal impurities;

the concentration of trace metals and metalloids in the SAM precursors each ranging from approximately 0 ppb to approximately 100 ppb; and the concentration of trace metals and metalloids in the SAM precursors each ranging from approximately 0 ppb to approximately 10 ppb.

Also disclosed are processes of forming a self-assembling monolayer (SAM) on a surface, the processes comprising the steps of preparing the surface for exposure of the surface to a SAM forming composition, the composition comprising a SAM precursor having a backbone with a surface reactive group X, wherein the backbone contains no Si—C bonds and is selected from the group consisting of a Si—C-free polysilane and a trisilylamine, wherein the surface reactive group X is selected from:

a halide (C, Br, I);

a cyanate, an isocyanate or a thiocyanate group;

an amino group $\text{—}NR^1R^2$, wherein $R^1$ is selected from H, a linear, branched or cyclic $C_1$-$C_{10}$ alkyl or alkenyl group or an alkyl silyl group, $R^2$ is selected from a linear, branched or cyclic $C_2$-$C_{10}$ alkyl or alkenyl group, or an alkyl silyl group; or $R^1$ and $R^2$ are bridged so that $NR^1R^2$ forms a cyclic ligand, provided that the cyclic ligand includes heteroatoms S, N or O;

an amidinate group $\text{—}R^3\text{—}N\text{—}C(R^4)\!=\!N\text{—}R^5$ wherein $R^3$ and $R^5$ are each independently selected from a $C_1$ to $C_{10}$ linear or branched alkyl or a trialkylsilyl; and $R^4$ is selected from H, a $C_1$ to $C_{10}$ linear or branched alkyl; or a thiol —SH group, a phosphonic acid or a carboxylic acid;

exposing of the surface to the SAM forming composition; and forming the SAM on the surface. The disclosed processes may include one or more of the following aspects;

the SAM forming composition being a solution;

the exposure of the surface to the SAM forming composition being a liquid phase exposure;

the SAM forming composition being a vapor; and the exposure of the surface to the SAM forming composition being a gas phase exposure.

Also, disclosed are film-forming process, the processes comprising the steps of:

preparing a surface on a substrate for exposure of the surface to a self-assembling monolayer (SAM) forming composition, the composition comprising a SAM precursor having a backbone with a surface reactive group X, wherein the backbone contains no Si—C bonds and is selected from the group consisting of a Si—C-free polysilane and a trisilylamine, wherein, when the surface to be covered is a dielectric surface, the surface reactive group X is selected from:

a halide (Cl, Br, I);

a cyanate, an isocyanate or a thiocyanate group;

an amino group $\text{—}NR^1R^2$, wherein $R^1$ is selected from H, a linear, branched or cyclic $C_1$-$C_{10}$ alkyl or alkenyl group or an alkyl silyl group; $R^2$ is selected from a linear, branched or cyclic $C_2$-$C_{10}$ alkyl or alkenyl group, or an alkyl silyl group; or $R^1$ and $R^2$ are bridged so that $NR^1R^2$ forms a cyclic ligand, provided that the cyclic ligand includes heteroatoms S, N or 0:

an amidinate group —$R^3$—N—C($R^4$)=N—$R^5$, wherein $R^3$ and $R^5$ are each independently selected from a $C_1$ to $C_{10}$ linear or branched alkyl or a trialkylsilyl; and $R^4$ is selected from H, a $C_1$ to $C_{10}$ linear or branched alkyl; or a thiol —SH group, a phosphonic acid or a carboxylic acid;

exposing of the surface to the SAM forming composition;

forming the SAM on the surface through a liquid or gas phase exposure; and growing a film on top of the SAM through a wet or dry deposition process using a film-forming precursor. The disclosed processes may include one or more of the following aspects:

the film-forming precursor being a metal or metalloid precursor, wherein the backbone of the SAM precursor acts as a reducing agent to the metal or metalloid precursor;

the metal precursor being selected from a main group element, or a transition metal element selected from Ti, Ta, W, Mo, Nb, or V, a fluoride, a chloride, a bromide, an iodide, an oxychloride, an oxybromide, an oxyfluoride or combination thereof;

the metal precursor being selected from $WF_6$, $WOF_4$, $WOCl_4$, $WCl_6$, $WCl_5$, $MoCl_5$, $MoOCl_4$, $MoO_2Cl_2$, $TiCl_4$, $TiBr_4$, $TiI_4$, $TaCl_5$, $AlCl_3$, $VCl_4$, $NbCl_5$, $BCl_3$, $BBr_3$, $GeCl_4$, $GeBr_4$ or $GeCl_2$, $GeBr_2$ or combination thereof;

the film being a polycarbosilazane film;

the Si film being a porous Silicon deposited by PECVD;

the wet deposition process being spin-on-deposition process;

the dry deposition process being an ALD or CVD process;

the substrate being any solid that has functional groups on its surface that are prone to react with the reactive head X of a SAM;

the substrate being silicon wafers, glass wafers and panels, beads, powders and nano-powders, monolithic porous media, printed circuit board, plastic sheets, etc;

the substrate being a powder used in rechargeable battery technology;

the substrate being NMC (Lithium Nickel Manganese Cobalt Oxide), LCO (Lithium Cobalt Oxide), LFP (Lithium Iron Phosphate), and other battery cathode materials;

the substrate being powders; and the substrate being nano-powders.

Notation and Nomenclature

The following detailed description and claims utilize a number of abbreviations, symbols, and terms, which are generally well known in the art.

As used herein, the indefinite article "a" or "an" means one or more.

As used herein, "about" or "around" or "approximately" in the text or in a claim means ±10% of the value stated.

As used herein, "room temperature" in the text or in a claim means from approximately 20° C. to approximately 25° C.

The term "ambient temperature" refers to an environment temperature approximately 20° C. to approximately 25° C.

As used in the disclosed embodiments, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

The term "substrate" refers to a material or materials on which a process is conducted. The substrate may refer to a wafer having a material or materials on which a process is conducted. The substrates may be any suitable wafer used in semiconductor, photovoltaic, flat panel, or LCD-TFT device manufacturing. The substrate may also have one or more layers of differing materials already deposited upon it from a previous manufacturing step. For example, the wafers may include silicon layers (e.g., crystalline, amorphous, porous, etc.), silicon containing layers (e.g., $SiO_2$, SiN, SiON, SiCOH, etc.), metal containing layers (e.g., copper, cobalt, ruthenium, tungsten, platinum, palladium, nickel, ruthenium, gold, etc.) or combinations thereof. Furthermore, the substrate may be planar or patterned. The substrate may be an organic patterned photoresist film. The substrate may include layers of oxides which are used as dielectric materials in MEMS, 3D NAND, MIM, DRAM, or FeRam device applications (for example, $ZrO_2$ based materials, $HfO_2$ based materials, $TiO_2$ based materials, rare earth oxide based materials, ternary oxide based materials, etc.) or nitride-based films (for example, TaN, TiN, NbN) that are used as electrodes. One of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates. The substrate can be any solid that has functional groups on its surface that are prone to react with the reactive head of a SAM, and may include without limitation 3D objects or powders.

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line.

The terms "via", "aperture" and "hole" are sometimes used interchangeably, and generally mean an opening in an interlayer insulator.

As used herein, the abbreviation "NAND" refers to a "Negated AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

The standard abbreviations of the elements from the periodic table of elements are used herein. It should be understood that elements may be referred to by these abbreviation (e.g., Si refers to silicon, N refers to nitrogen, O refers to oxygen, C refers to carbon, H refers to hydrogen, F refers to fluorine, etc.).

The unique CAS registry numbers (i.e., "CAS") assigned by the Chemical Abstract Service are provided to identify the specific molecules disclosed.

The term "wafer" or "patterned wafer" refers to a wafer having a stack of silicon-containing films on a substrate and a patterned hardmask layer on the stack of silicon-containing films formed for pattern etch. The term "wafer" or "patterned wafer" may also refers to a trench wafer having an aspect ratio.

Note that herein, the terms "deposition temperature" and "substrate temperature" may be used interchangeably. It is understood that a substrate temperature may correspond to, or related to a deposition temperature, and that the deposition temperature may refer to the substrate temperature.

Note that herein, the terms "precursor" and "deposition compound" and "deposition gas" may be used interchangeably when the precursor is in a gaseous state at room temperature and ambient pressure. It is understood that a precursor may correspond to, or related to a deposition compound or deposition gas, and that the deposition compound or deposition gas may refer to the precursor.

As used in the disclosed embodiments, the term "hydrocarbyl group" refers to a functional group containing carbon and hydrogen; the term "alkyl group" refers to saturated functional groups containing exclusively carbon and hydrogen atoms. The hydrocarbyl group may be saturated or unsaturated. Either term refers to linear, branched, or cyclic groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used in the disclosed embodiments, the abbreviation "Me" refers to a methyl group; the abbreviation "Et" refers to an ethyl group; the abbreviation "Pr" refers to a propyl group.

Ranges may be expressed herein as from about one particular value, and/or to about another particular value. When such a range is expressed, it is to be understood that another embodiment is from the one particular value and/or to the other particular value, along with all combinations within said range. Any and all ranges recited herein are inclusive of their endpoints (i.e., x=1 to 4 or x ranges from 1 to 4 includes x=1, x=4, and x=any number in between), irrespective of whether the term "inclusively" is used.

Reference herein to "one embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF PREFERRED EMBODIMENTS

Figure 1:
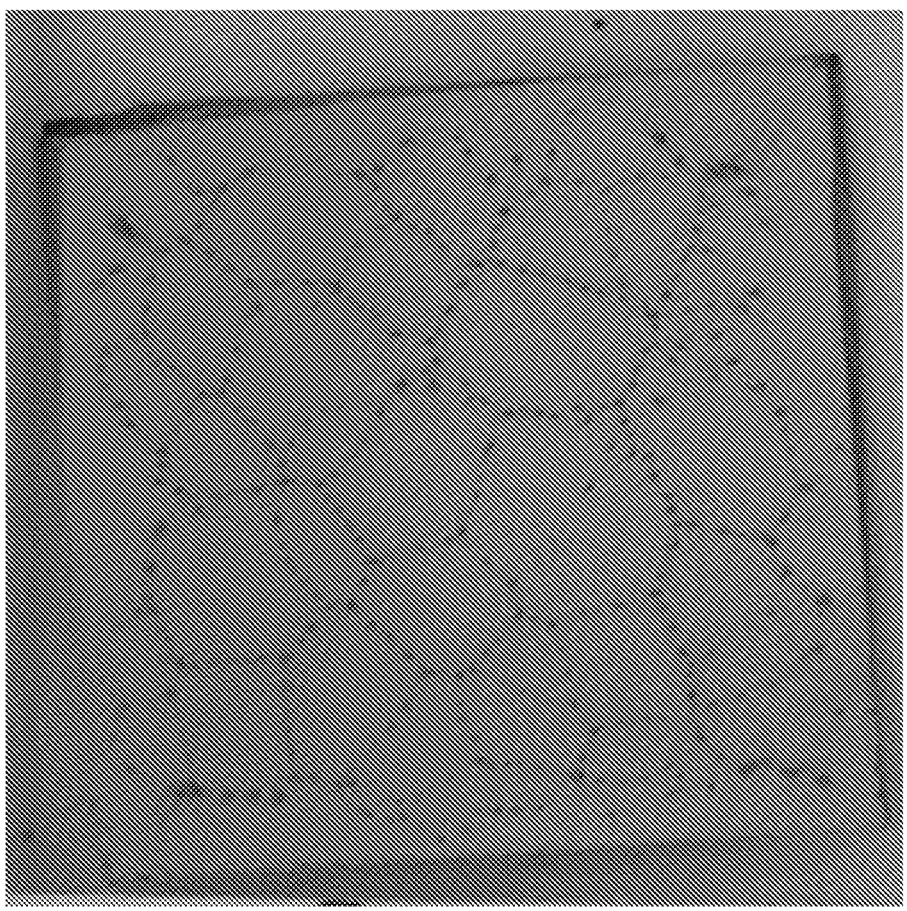
FIG. 1 is spin-on deposited thin film residues aggregated in cluster when using HMDS as adhesion agent.

Self-assembling monolayer (SAM) monomers having a Si-based tail or backbone (SiT-SAM) that contains no Si—C bonds, their syntheses, and their applications in surface preparations in film forming processes are disclosed.

The disclosed SiT-SAM monomers are described as a backbone with a surface reactive group (or head) (denoted as "X").

When a surface to be covered is a dielectric surface, the surface reactive group "X" is reactive to a surface hydroxyl (—OH) group. In this case, X is selected from:

a. a halide (Cl, Br, I);
b. a cyanate, an isocyanate or a thiocyanate group;
c. an amino group —$NR^1R^2$, wherein $R^1$ is selected from H, a linear, branched or cyclic $C_1$-$C_{10}$ alkyl or alkenyl group or an alkyl silyl group; $R^2$ is selected from a linear, branched or cyclic $C_2$-$C_{10}$ alkyl or alkenyl group, or an alkyl silyl group; or $R^1$ and $R^2$ are bridged so that $NR^1R^2$ forms a cyclic ligand, provided that the cyclic ligand includes heteroatoms S, N or O; or
d. an amidinate group —$R^3$—N—$C(R^4)$=N—$R^5$, wherein $R^3$ and $R^5$ are each independently selected from a $C_1$ to $C_{10}$ linear or branched alkyl or a trialkylsilyl; and $R^4$ is selected from H, a $C_1$ to $C_{10}$ linear or branched alkyl.

Preferably, X is a dialkylamino group —$NR^1R^2$ wherein $R^1$ is selected from H or a $C_2$ to $C_5$ alkyl; and $R^2$ is a $C_1$ to $C_5$ alkyl. If $R^1$=H, $R^2$ is $C_3$ or more, and if $R^1$ not H, $R^1$ and $R^2$ are preferably identical. Preferably, X is an amidinate group —$NR^3$—$C(R^4)$=N—$R^5$ wherein $R^3$ and $R^5$ are each independently selected from Et, nPr, iPr, nBu, tBu, sBu, iBu, and $R^4$ is H, Me.

When a surface to be covered is a metal, the surface reactive head "X" is a thiol —SH group, phosphonic acid or carboxylic acid. For example, the thiol group reacts to the metal surface forming a sulfur-metal interface.

The disclosed SiT-SAM monomers are molecules suitable to form SAMs on a surface of a substrate in the film forming processes. The monomer backbones of the disclosed SiT-SAM monomers may be selected from the group consisting of (i) a Si—C-free polysilane, containing at least one Si—Si bond and no direct Si—C bond and (ii) a trisilylamine (TSA).

More specifically, the disclosed SiT-SAM monomers are Si—C-free polysilane-based SiT-SAM monomers comprising (i) the Si—C-free polysilane backbone and an "X" surface reactive group.

The disclosed Si—C-free polysilane-based SiT-SAM monomers are selected from

X—(SiH$_2$)$_n$—SiH$_3$ wherein n=1 to 3,
X—(Si$_n$H$_{2n}$) wherein Si$_n$H$_{2n}$ refers to a cyclic hydridosilane backbone with n=5, 6, 7,
X—(SiH(SiH$_3$)$_2$), or
X—SiH$_2$—Si(SiH$_3$)$_3$.

Preferably the polysilane backbone is —SiH$_2$—SiH$_3$ or —SiH$_2$—SiH$_2$—SiH$_3$.

Exemplary Si—C-free polysilane-based SiT-SAM monomers include NiPr$_2$—(SiH$_2$)—SiH$_3$, NnBu$_2$-(SiH$_2$)—SiH$_3$, NtBu$_2$-(SiH$_2$)—SiH$_3$, NsBu$_2$-(SiH$_2$)—SiH$_3$, NiBu$_2$-(SiH$_2$)—SiH$_3$, NPen$_2$-(SiH$_2$)—SiH$_3$, NnPr$_2$—(SiH$_2$)$_2$—SiH$_3$, NiPr$_2$—(SiH$_2$)$_2$—SiH$_3$, NnBu$_2$-(SiH$_2$)$_2$—SiH$_3$, NtBu$_2$-(SiH$_2$)$_2$—SiH$_3$, NsBu$_2$-(SiH$_2$)$_2$—SiH$_3$, NiBu$_2$-(SiH$_2$)$_2$—SiH$_3$, NsPen$_2$-(SiH$_2$)$_2$—SiH$_3$, NHtBu-(SiH$_2$)$_2$—SiH$_3$, NHPen-(SiH$_2$)$_2$—SiH$_3$, NHsBu-(SiH$_2$)$_2$—SiH$_3$, NHiBu-(SiH$_2$)$_2$—SiH$_3$, NnPr$_2$—(SiH$_2$)$_3$—SiH$_3$, NiPr$_2$—(SiH$_2$)$_3$—SiH$_3$, NnBu$_2$-(SiH$_2$)$_3$—SiH$_3$, NtBu$_2$-(SiH$_2$)$_3$—SiH$_3$, NsBu$_2$-(SiH$_2$)$_3$—SiH$_3$, NiBu$_2$-(SiH$_2$)$_3$—SiH$_3$, NsPen$_2$-(SiH$_2$)$_3$—SiH$_3$, NEt$_2$-(SiH(SiH$_3$)$_2$), NiPr$_2$—(SiH(SiH$_3$)$_2$), NnPr$_2$—(SiH(SiH$_3$)$_2$), NiBu$_2$-(SiH(SiH$_3$)$_2$), NtBu$_2$-(SiH(SiH$_3$)$_2$), NnBu$_2$-(SiH(SiH$_3$)$_2$), NsBu$_2$-(SiH(SiH$_3$)$_2$), NsPen$_2$-(SiH(SiH$_3$)$_2$), NHtBu-(SiH(SiH$_3$)$_2$), NHnBu-(SiH(SiH$_3$)$_2$), NHiBu-(SiH(SiH$_3$)$_2$), and NHPen-(SiH(SiH$_3$)$_2$).

Furthermore, the disclosed SiT-SAM monomers are TSA-based SiT-SAM monomers comprising (ii) the TSA backbone and an "X" head. The TSA-based SiT-SAM monomers contain at least one N(—Si)$_3$ unit in their backbone and one or two "X" surface reactive groups. For simplicity, H and non-hydrolysable groups are not represented throughout the entire description and claims.

The disclosed TSA-based SiT-SAM monomers have a general formula

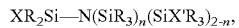

XR$_2$Si—N(SiR$_3$)$_n$(SiX'R$_3$)$_{2-n}$, wherein X' has the same definition as X as described above and is independent from X; n=1 or 2; R is selected from H, a C$_1$ to C$_6$ branched or linear alkyl chain. Preferably, each R=H, in which case the formula becomes XH$_2$Si—N(SiH$_3$)$_n$(SiX'H$_3$)$_{2-n}$. Preferably, n=2, in which case the formula becomes XR$_2$Si—N(SiR$_3$)$_2$. The TSA-based SiT-SAM monomers may contain more than one N(—Si)$_3$ units and have backbones such as (Si)$_2$N—Si—N(Si)Si—X or X—Si—N(Si)—Si—N(Si)Si—X.

The disclosed SiT-SAM monomers may be used for exposure to a surface or substrate in a liquid phase, either pure or preferably diluted in a solvent, which is inert to the disclosed SiT-SAM monomer and to the surface reactive groups. The solvents are typically non-protic solvents such as hydrocarbons, toluene, ethers, trialkylamines, etc. The surface or substrate exposure may be achieved by any coating method such as dip coating, spin coating, spray coating. The exposure may last between 1 seconds and 24 hours. After exposure, the surface or substrate is preferably rinsed with the solvent and dried. The existence and characteristics of a suitable SAM layer may be assessed by techniques such as water contact angle (WCA), attenuated total reflection FTIR (ATR-FTIR), or high angle XPS.

Alternatively, the disclosed SiT-SAM monomers may be used for exposure to a surface or substrate in a gas phase. Again, the method used for forming SiT-SAM does not differ from methods used for forming classical SAMs, such as the one described by F. Schreiber ("Structure and growth of self-assembling monolayers", Frank Schreiber, Progress in Surface Science, Vol. 65, issues 5-8, 2000, 151-257). The surface or substrate is preferably heated to promote the reaction of surface sites with the disclosed SiT-SAM monomers, typically at a temperature ranging from room temperature to approximately 45° ° C., which is the temperature at which the disclosed SiT-SAM monomers typically self-decompose. The exposure time may range from 1 second to 24 hours, preferably no more than 10 minutes.

Whether the exposure to the disclosed SiT-SAM monomer is done in the gas phase or liquid phase, the surface/substrate may be pre-treated to improve the reaction of the disclosed SiT-SAM monomer with the surface. Such treatment may increase the reactive site density (e.g., —OH on an oxide surface), decrease the film adventitious contamination (e.g, carbon on a metal surface), or remove a passivating oxide on a metal, Such dry or wet surface preparations and cleaning techniques are well known in the arts and may be applied to the usage with the disclosed SiT-SAM monomers.

The substrate final application is not limited to the present invention, but this technology may find particular benefits for the following types of substrates: silicon wafers, glass wafers and panels, beads, powders and nano-powders, monolithic porous media, printed circuit board, plastic sheets, etc. Exemplary powder substrates include a powder used in rechargeable battery technology. A non-limiting number of powder materials include NMC (Lithium Nickel Manganese Cobalt Oxide), LCO (Lithium Cobalt Oxide), LFP (Lithium Iron Phosphate), and other battery cathode materials.

It is understood that substrate designates physical elements and their composition may differ from the composition of the layer(s) onto which the disclosed SiT-SAM monomers are deposited. For instance, a silicon wafer may be coated with various dielectric (SiO$_2$, SiN, SiC, SiCOH, SiCN, SiON, SiOCN, a-C, etc), semiconductor (Ge, SiGe, GeSn, InGaAs, GaSb, InP, etc), or conductive films (Cu, Co, W, Al, Mo, MoN, Ti, TiN, TaN, Ru, Pt, Pd, WN, WC, Ni, etc.)

Like classical SAM and specifically silylating SAMs, the disclosed SiT-SAM monomers are useful to improve the wettability of substrate to certain solution-based film forming formulations such as spin on dielectrics, anti-reflective coatings, or photoresist materials.

Unlike classical SAMs, which only act as surface blocking agents, the disclosed SiT-SAM monomers may prove beneficial as their Si-tail exhibits interesting chemical reactivity that may be beneficial for further processing of the surface. As such, the disclosed SiT-SAM monomers act as a way to direct certain reactions on the surface that the disclosed SiT-SAM monomers specifically cover, as opposed to plainly blocking a surface, and may thus act as a positive mask for area selective deposition processes.

To ensure process reliability, the disclosed SiT-SAM monomers may be purified by continuous or fractional batch distillation or sublimation prior to use to a purity ranging from approximately 95% by weight or w/w to approximately 100% w/w, preferably ranging from approximately 99% w/w to approximately 99.999% w/w, more preferably, ranging from approximately 99% w/w to approximately 100% w/w.

The disclosed SiT-SAM monomers may contain any of the following impurities: undesired congeneric species; solvents; or other reaction products. In one alternative, the total quantity of these impurities is below 5.0% w/w, preferably, below 0.1% w/w.

Solvents, such as hexane, pentane, dimethyl ether, or anisole, may be used in the precursor's synthesis. The concentration of the solvent in the disclosed SiT-SAM monomers may range from approximately 0% w/w to approximately 5% w/w, preferably from approximately 0% w/w to approximately 0.1% w/w. Separation of the solvents from the precursor may be difficult if both have similar boiling points. Cooling the mixture may produce solid precursor in liquid solvent, which may be separated by filtration. Vacuum distillation may also be used, provided the precursor product is not heated above approximately its decomposition point.

In one alternative, the disclosed SiT-SAM monomers contain less than 5% v/v, preferably less than 1% v/v, more preferably less than 0.1% v/v, and even more preferably less than 0.01% v/v of any of its undesired congeneric species, reactants, or other reaction products. This alternative may provide better process repeatability. This alternative may be produced by distillation of the disclosed SiT-SAM monomers.

In another alternative, the disclosed SiT-SAM monomers may contain between 5% v/v and 50% v/v of one or more of congeneric monomers, or other reaction products, particularly when the mixture provides improved process parameters or isolation of the target compound is too difficult or expensive. For example, a mixture of two SiT-SAM monomers may produce a stable, liquid mixture suitable for SAM formation.

In another alternative, the disclosed SiT-SAM monomers may contain between approximately 0 ppbw and approximately 500 ppbw metal impurities. The concentration of trace metals and metalloids in the disclosed SiT-SAM monomers may each range from approximately 0 ppb to approximately 100 ppb, and more preferably from approximately 0 ppb to approximately 10 ppb.

This disclosure also includes processes of forming a SAM on a surface. The process comprises the steps of preparing the surface for exposure of the surface to the disclosed SAM forming composition; exposing of the surface to the SAM forming composition; and forming the SAM on the surface. When the SAM forming composition is a solution, the exposure of the surface to the SAM forming composition is a liquid phase exposure. When the SAM forming composition is a vapor, the exposure of the surface to the SAM forming composition is a gas phase exposure.

The disclosed also includes film forming processes using the disclosed SiT-SAM monomers. The process comprises the steps of preparing the surface for exposure of the surface to a SAM forming composition; exposing of the surface to the SAM forming composition; forming the SAM on the surface through a liquid or gas phase exposure; and growing a film on top of the SAM through a wet or dry deposition process using a film-forming precursor. When the SAM forming composition is a solution, the exposure of the surface to the SAM forming composition is a liquid phase exposure. The step of exposing of the surface to the SAM forming composition may be a liquid phase exposure or a gas phase exposure. When the SAM forming composition is a vapor, the exposure of the surface to the SAM forming composition is a gas phase exposure. The wet deposition process may be a spin-on-deposition process and the dry deposition process may be an ALD or CVD process.

In one exemplary embodiment, a precursor used for depositing a film over the SAM formed by the SiT-SAM monomer may be a metal or metalloid precursor, and the tail of the SiT-SAM monomer acts as a reducing agent to the metal or metalloid precursor. The metal precursor may be preferably selected from a main group element, or a transition metal element selected from Ti, Ta, W, Mo, Nb, or V. The metal precursor may be a fluoride, chloride, a bromide, an iodide, an oxychloride, an oxybromide, an oxyfluoride, or combinations thereof. More specifically, the metal or metalloid precursor may be selected from $WF_6$, $WOF_4$, $WOCl_4$, $WCl_6$, $WCl_5$, $MoCl_5$, $MoOCl_4$, $MoO_2Cl_2$, $TiCl_4$, $TiBr_4$, $TiI_4$, $TaCl_5$, $AlCl_3$, $VCl_4$, $NbCl_5$, $BCl_3$, $BBr_3$, $GeCl_4$, $GeBr_4$ or $GeCl_2$, $GeBr_2$, or combinations thereof. It is noted that several of these halides compounds may form stable and volatile adducts, and may be used in such a form of thin film deposition, for example, $GeCl_2$:dioxane, $TaCl_5$:$SEt_2$, $TiBr_4$:$SiPr_2$.

In addition to the precursor, a reactant or a co-reactant may also be introduced into the reactor. The co-reactant may be an oxygen-containing gas or a nitrogen-containing gas. The co-reactants include, but are not limited to, oxidizers such as, $O_3$, $O_2$, $H_2O$, $H_2O_2$, $D_2O$, ROH (R is a $C_1$-$C_{10}$ linear or branched hydrocarbon), etc. $H_2O$ and ROH (R is a $C_1$-$C_{10}$ linear or branched hydrocarbon) are preferred oxidation sources to avoid reacting with the SAM layer formed on the substrates. The nitrogen-containing gas includes, but is not limited to, $NH_3$, NO, $N_2O$, hydrazines, primary amines such as methylamine, ethylamine, tertbutylamine; secondary amines such as dimethylamine, diethylamine, diisopropylamine, ethylmethylamine, pyrrolidine; tertiary amines such as trimethylamine, triethylamine, trisilylamine, $N_2$, $N_2/H_2$ mixture thereof, preferably $NH_3$. The co-reactant may be selected from $H_2$, $NH_3$, NO, $N_2O$, hydrazines, amines or combinations thereof. Preferably, plasma-treated co-reactants are avoided as they tend to damage the SAM layer, unless the SAM layer is re-formed at each ALD cycle.

EXAMPLES

The following non-limiting examples are provided to further illustrate embodiments of the invention. However, the examples are not intended to be all inclusive and are not intended to limit the scope of the inventions described herein.

Comparative Example 1

Using Hexamethyldisilazane, $Me_3Si$—NH—$SiMe_3$ (HMDS), as an Adhesion Promoter Agent to Deposit a Polycarbosilazane Film A silicon wafer with native oxide, cut into coupons 2×2 cm, was cleaned for 10 min under ultraviolet-ozone cleaning (hereinafter referred to as UV—$O_3$ cleaning) to remove organic contaminants. After UV—$O_3$ cleaning, the surface was completely hydrophilic, showing a distilled deionized water contact angle <5°. Afterwards, the coupon was brought into a $N_2$ glovebox and 200 µl of HMDS solution was spun onto it for 60 s at 2000 rpm using Brewer Science Cee 200× spin coater. After spinning the HDMS adhesion promoter, the surface shows a hydrophobic character with an average contact angle of 95°. Afterwards, 200 µl polycarbosilazane solution was spun for 60 s at 2000 rpm. Spin-on process has been followed by prebake step in the $N_2$ glovebox at 200° C. for 5 min to promote solvent and volatile evaporation.

FIG. 1 shows that spin-on deposited thin film residues aggregated in clusters when using HMDS as adhesion agent. After the prebake step, the polycarbosilazane thin film that was formed during the spin-on process was completely degraded and the material left aggregated into islands.

Thus, this example demonstrates that HMDS, which is a common adhesion promoter used in the industry, may not be compatible with the polycarbosilazane polymer used since it may not favor the adhesion between the polymer and the silicon coupon.

Example 1

Syntheses of (Diisopropylamine)trisilylamine (($CMe_2$)$_2$-N—$SiH_2$—N—($SiH_3$)$_2$, TSA-N($CMe_2$)$_2$)

TSA-N($CMe_2$)$_2$ SAM precursor is synthesized in a pressurized reactor by the reaction between trisilylamine (TSA) and diisopropylamine ($Me_2$-CH)$_2$—NH) catalyzed by commercially available Ruthenium on carbon catalyst: A 0.3 L autoclave equipped with a mechanical stirrer, a thermocouple, a pressure gauge and a pressure transducer and 3 metering valves was charged with 5.3 g (0.0025 mmol of ruthenium) of 5% weight ruthenium on carbon catalyst. The reactor was then heated under dynamic vacuum at about 125° C. for 3 hr. Dynamic vacuum as used herein describes a vacuum of about 1 Torr. After cooling to room temperature, 14.8 g (0.202 mol) of diisopropylamine was added to the reactor and then it was cooled to about −130° C. in a liquid nitrogen bath. 40 g (0.372 mol) of trisilylamine was transferred to the reactor. The reactor was then gradually heated to about 100° C. After stirring at about 400 rpm for 65 rpm, pressure increased about 300 psi. The pressure increase is proportional to the amount of hydrogen (and product) formed, so it will vary depending on the scale of the reaction. The reaction is complete when the pressure stops increasing. It may be desirable to stop the reaction before it is complete. The reactor was cooled to room temperature ("RT"). Volatiles were collected in a cryotrap at liquid nitrogen temperature in a SSLB. The reactor pressure went down to 50 Torr.

The resulting solution contained about 30% (11.3 g) of TSA-N($CMe_2$)$_2$. The non-isolated yield was 30%.

Example 2

Synthesis of Chlorotrisilylamine ($SiH_2$)$_2$—N—$SiH_2$Cl, TSA-Cl)

TSA-Cl SAM precursor is synthesized according to the reaction: $SnCl_4$+N($SiH_3$)$_3$→N($SiH_3$)$_2$($SiH_2$Cl)+$SnCl_2$↓+HCl (see *J. Chem. Soc. Dalton Trans.* 1975, p. 1624). Alternatively, dichlorosilane [$SiH_2Cl_2$] and monochlorosilane [SiH—X] may be introduced continuously in the gas phase in a ¹⁄₂₀ to ¼ ratio and at room temperature with 400 sccm of $NH_3$ in a flow-through tubular reactor as described by Miller in U.S. Pat. No. 8,669,387. The reaction of $NH_3$ with 2 equivalents of monochlorosilane produces mostly disilylamine (DSA). DSA then reacts with the dichlorosilane to form ($SiH_3$)$_2$—N—$SiH_2$Cl and HCl. One of ordinary skill in the art would recognize that the reaction may take place in one or two steps (first forming DSA from the monochlorosilane and $NH_3$ and second adding dichlorosilane) or in one step (combining the monochlorosilane, dichlorosilane, and $NH_3$ in one step).

Example 3

Synthesis of Amine Substituted Polysilane

The amine substituted polysilanes may be synthesized through the following steps.
  a) contacting the reactants $R^1R^2$NH and $R^3R^4$NH and $Si_mH_{2(m+1)}$ in the presence of a transition metal catalyst forming a reaction mixture;
  b) optionally adding a solvent to the reaction mixture;
  c) maintaining the reaction mixture at a temperature between about 0° C. to about 300° C.;
  d) allowing the reactions to proceed to form ($R^1R^2$N)$_{n1}$($R^3R^4$N)$_{n2}Si_mH_{2(m+1)-n1-n2)}$;
  e) separating the ($R^1R^2$N)$_{n1}$($R^3R^4$N)$_{n2}Si_mH_{(2(m+1)-n1-n2)}$ from the reaction mixture;

wherein the reaction mixture temperature may vary during the synthesis and is maintained such that the temperature of the reaction mixture is not allowed to drop below about 0° C. and not exceed about 300° C.

For example, the structure formula for m=3; $R^1$=$R^2$=isopropyl; n1=1; n2=0 is as follows.

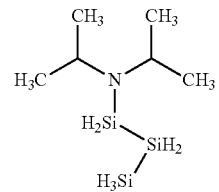

wherein the reactants are $Me_2$NH and $Si_3H_3$. See e.g. U.S. Pat. No. 10,494,387.

Example 4

Synthesis of Amidinate (AMD, —$R^1$HN(C$R^3$)=N$R^2$,

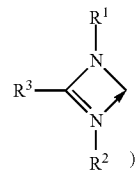

Substituted Polysilane

AMD substituted polysilanes refer to ($R^1$HN(C$R^3$)=N$R^2$)$_n$—$Si_mH_{(2(m+1)-n))}$, where n=1 to (2(m+1); m=2 to 6; $R^1$ and $R^2$ are each independently selected from the group consisting of linear or branched $C_1$ to $C_6$ alkyl, linear or branched $C_1$ to $C_8$ alkenyl, linear or branched $C_1$ to $C_8$ alkynyl, $C_6$ to $C_{10}$ aryl, linear or branched $C_1$ to $C_6$ alkyl ether, silyl, trimethyl silyl, or linear or branched $C_1$ to $C_6$ alkyl-substituted silyl.

Replacing $R^1R^2$NH with $R^1$HN(C$R^3$)=N$R^2$ in the above synthesis process of amine substituted polysilanes in Example 3, the AMD substituted polysilanes will be formed. See, e.g., U.S. Pat. No. 10,494,387.

Example 5

Synthesis of X Substituted Bi-Disilylaminohalogensilane (BDSASi—X), Wherein X=F, Cl, Br or I SAM precursor BDSASi—X (F, Cl, Br, I) are preferentially synthesized from a direct reaction of ($SiH_3$)$_2$N—$SiH_2$—N($SiH_3$)$_2$(BDSASi) with a halogen acid by dehydrogenative coupling, according to the same protocol as described in U.S. Pat. App. Pub. No. 2015/0094470.

$(SiH_3)_2N-SiH_2-N(SiH_3)_2 + nHX \rightarrow [N(SiH_{3-m}(X)_m]-SiH_2-[SiH_{3-n}(X)_n] + (m+n)H_2$ with m=0 to 3, n=1 to 3.

The reaction being carried neat or in an aprotic solvent such as, but not limited to a $C_3$-$C_{24}$ hydrocarbon solvent, toluene, benzene, diethylether, acetonitrile, or THF.

The reaction being carried at a temperature between room temperature and 150° C., preferably at 30-60° C.

Optionally, the catalyst being filtered from the reaction mixture and the components of the remaining liquid composition being separated by distillation.

Optionally, the reaction mixture being treated with an agent to de-activate the catalyst, selected but not limited to a tertiary amine or a coordinant compound such as $XNR_4$ (X=F, Cl, Br, I; R=alkyl), R—CN, $R_2S$, $PR_3$.

Optionally, the compound of BDSASi—X being purified by distillation to reach an assay of >98%, more preferably or >99%, and even more preferably >99.5%, which is typical of semiconductor grade precursors Optionally, the product may be filtered to reach specifications that are typical of products used in the semiconductor industry.

Example 6

Synthesis of Diisobutylaminetrisilane (DIBATS, $(iBu)_2$-N—$SiH_2$—$SiH_2$—$SiH_3$)

SAM precursor DIBATS is synthesized in a pressurized reactor from trisilane ($SiH_3$—$SiH_2$—$SiH_3$) and diisobutylamine (($iBu)_2$-NH) catalyzed by commercially available Ruthenium on carbon comprises. A 0.3 L autoclave equipped with a mechanical stirrer, a thermocouple, a pressure gauge and a pressure transducer and 3 metering valves was charged with 6 g (0.003 mmol of ruthenium) of 5% weight ruthenium on carbon catalyst. The reactor was then heated under dynamic vacuum at 125° C. for 3 hr. After cooling down to room temperature, the reactor was filled with 1 atm of helium, sealed and disconnected from the manifold and placed in a glove box. Inside the glove box, 20.7 (0.205 mol) of diisobutylamine was added. Then, the reactor was taken out from the glove box and reconnected to the manifold and cooled down to −130° C. in a liquid nitrogen bath. 40 g of trisilane (0.433 mol) was transferred to the reactor through the manifold. The reactor was then heated up to 100° C. After stirring at 400 rpm for 23 hr, the reactor was cooled down to room temperature. Volatiles were cryotrapped in a stainless steel lecture bottle (SSLB). The reaction vessel pressure dropped to 20 Torr. The DIBATS was recovered from the reactor vessel. The reaction solution contained 11.49 g of DIBATS. The non-isolated yield was 29%, See e.g., U.S. Pat. No. 10,494,387.

Example 7

Synthesis of Amidinateneopentylsilane (NPS-AMD, $C_5H_{11}$—$SiH_2$—$R^1HN(CR^3)$=$NR^2$)

The synthesis of SAM precursor NPS-AMD is as follows.
a) contacting the reactants amidine ($R^1HN(CR^3)$=$NR^2$) and neopentylsilane ($C_5H_{11}$—$SiH_3$), in the presence of a transition metal catalyst forming a reaction mixture; wherein $R^1$, $R^2$ and $R^3$ are independently selected from the group consisting of linear or branched $C_1$ to $C_6$ alkyl, linear or branched $C_1$ to $C_8$ alkenyl, linear or branched $C_1$ to $C_8$ alkynyl, $C_6$ to $C_{10}$ aryl, linear or branched $C_1$ to $C_6$ alkyl ether, silyl, trimethyl silyl, or linear or branched $C_1$ to $C_6$ alkyl-substituted silyl; where the molar ratio of neopentylsilane ($C_5H_{11}$—$SiH_3$) to ($R^1HN(CR^3)$=$NR^2$) is at least 1:1;
b) optionally adding a solvent to the reaction mixture;
c) maintaining the reaction mixture at a temperature between about 0° C. to about 300° C.;
d) allowing the reaction to proceed to form NPS-AMD ($C_5H_{11}$—$SiH_2$—($R^1N(CR^3)$=$NR^2$))
e) separating the product NPS-AMD from the reaction mixture; wherein the reaction temperature may vary during the synthesis and is maintained such that the temperature of the reaction mixture is not allowed to drop below about 0° C. and not exceed about 300° C. See e.g., U.S. Pat. No. 10,494,387.

Example 8

Synthesis of Dialkylaminoneopentylsilane (NPS—$NR^4R^5$)

In the above synthesis procedure of NPS-AMD in Example 7, replace the reactant amidine ($R^1HN(CR^3)$=$NR^2$) with amine $R^4R^5NH$, the product SAM precursor NPS-$NR^4R^5$ will be formed, wherein $R^4$ and $R^5$ are each independently H, linear or branched $C_1$ to $C_6$ alkyl, linear or branched $C_1$ to $C_8$ alkenyl, linear or branched $C_1$ to $C_8$ alkynyl, $C_6$ to $C_{10}$ aryl, linear or branched $C_1$ to $C_6$ alkyl. See e.g., U.S. Pat. No. 10,494,387.

Example 9

Synthesis of Amidinatecyclohexylsilane (CHS-AMD)

The synthesis of SAM precursor CHS-AMD is as follows.
a) contacting the reactants amidine ($R^1HN(CR^3)$=$NR^2$) and cyclohexylsilane ($C_6H_{11}$—$SiH_3$), in the presence of a transition metal catalyst forming a reaction mixture; wherein $R^1$, $R^2$ and $R^3$ are independently selected from the group consisting of linear or branched $C_1$ to $C_6$ alkyl, linear or branched $C_1$ to $C_6$ alkenyl, linear or branched $C_1$ to $C_8$ alkynyl, $C_6$ to $C_{10}$ aryl, linear or branched $C_1$ to $C_6$ alkyl ether, silyl, trimethyl silyl, or linear or branched $C_1$ to $C_6$ alkyl-substituted silyl; where the molar ratio of cyclohexylsilane ($C_6H_{11}$—$SiH_3$) to ($R^1HN(CR^3)$=$NR^2$) is at least 1:1;
b) optionally adding a solvent to the reaction mixture;
c) maintaining the reaction mixture at a temperature between about 0° C. to about 300° C.;
d) allowing the reaction to proceed to form the SAM precursor CHS-AMD ($C_6H_{11}$—$SiH_2$—($R^1N(CR^3)$=$NR^2$));
e) separating the product CHS-AMD from the reaction mixture; wherein the reaction temperature may vary during the synthesis and is maintained such that the temperature of the reaction mixture is not allowed to drop below about 0° C. and not exceed about 300° C. See e.g., U.S. Pat. No. 10,494,387.

Example 10

Synthesis of Dialkylaminocyclohexylsilane (CHS—$NR^4R^5$)

In the above synthesis procedure of CHS-AMD in Example 9, replace the reactant amidine ($R^1HN(CR^3)$=$NR^2$) with amine $R^4R^5NH$, the product SAM precursor CHS—$NR^4R^5$ will be formed, wherein $R^4$ and $R^5$ are each independently H, linear or branched $C_1$ to $C_6$ alkyl, linear or branched $C_1$ to $C_6$ alkenyl, linear or branched $C_1$ to $C_6$ alkynyl, $C_6$ to $C_{10}$ aryl, linear or branched $C_1$ to $C_6$ alkyl. See e.g., U.S. Pat. No. 10,494,387.

Example 11

Wet Coating of SiT-SAMs

Neat SiT-SAM monomer (0.2 mL) were deposited on $SiO_2$ (thermal oxide) wafers under $N_2$ atmosphere and room temperature. The wafers were then spun at 2000 RPM for 60 sec (i.e. until apparent dryness of the wafer). The wafers were either as received or pretreated under $O_3$ (5 min, room temperature) to clean and hydroxylate the surface. Water contact angle (WCA) measurement were immediately measured in air. The wafers were then baked under $N_2$ at 300° C. for 10 min, and the WCA was re-measured after the anneal.

Figure 2:
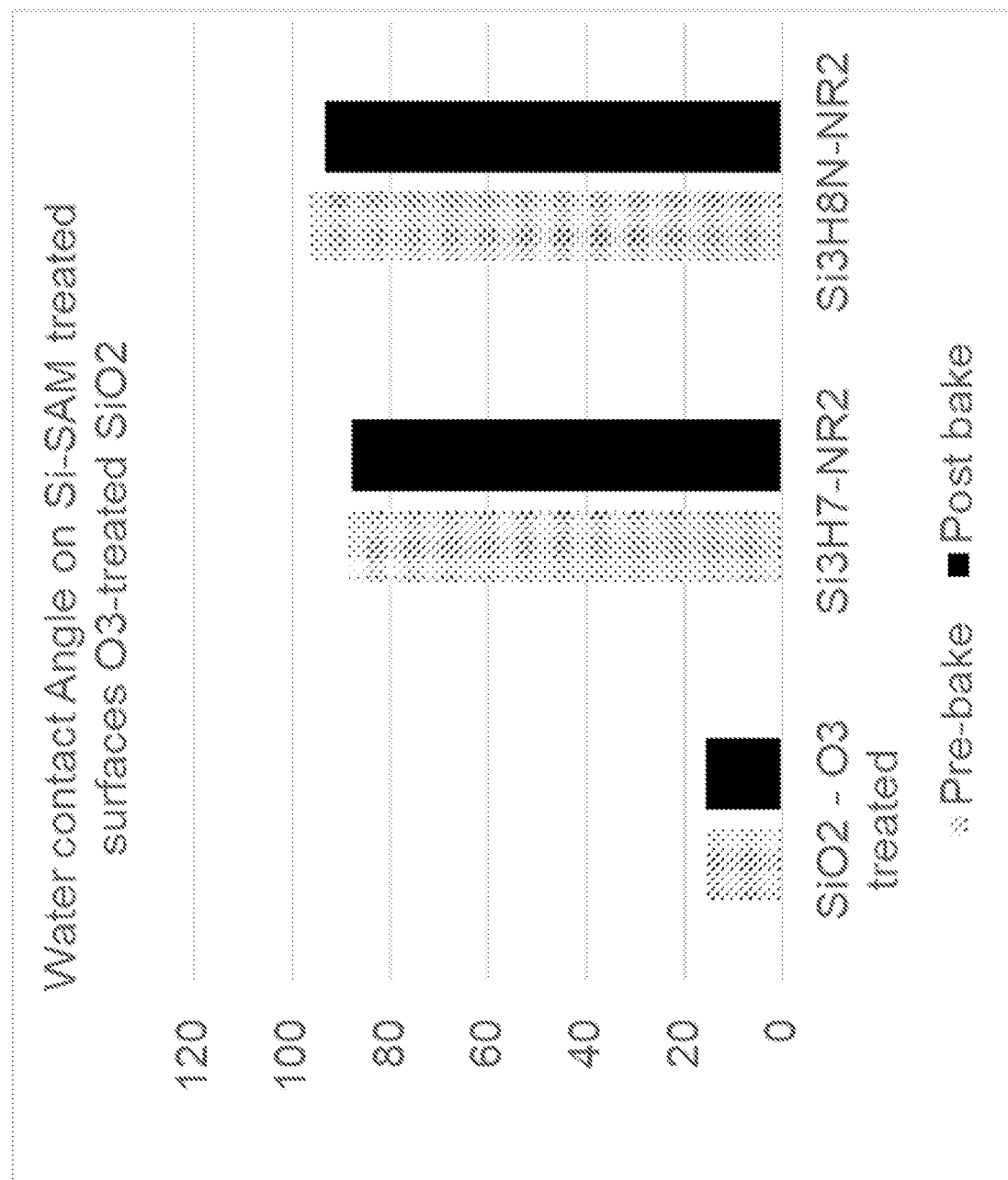
FIG. 2 is WCA results for the mono-amino trisilane ($Si_3H_7$—$NR_2$, wherein $R^1$ is a $C_2$ to $C_5$ alkyl) derivative.
Figure 3:
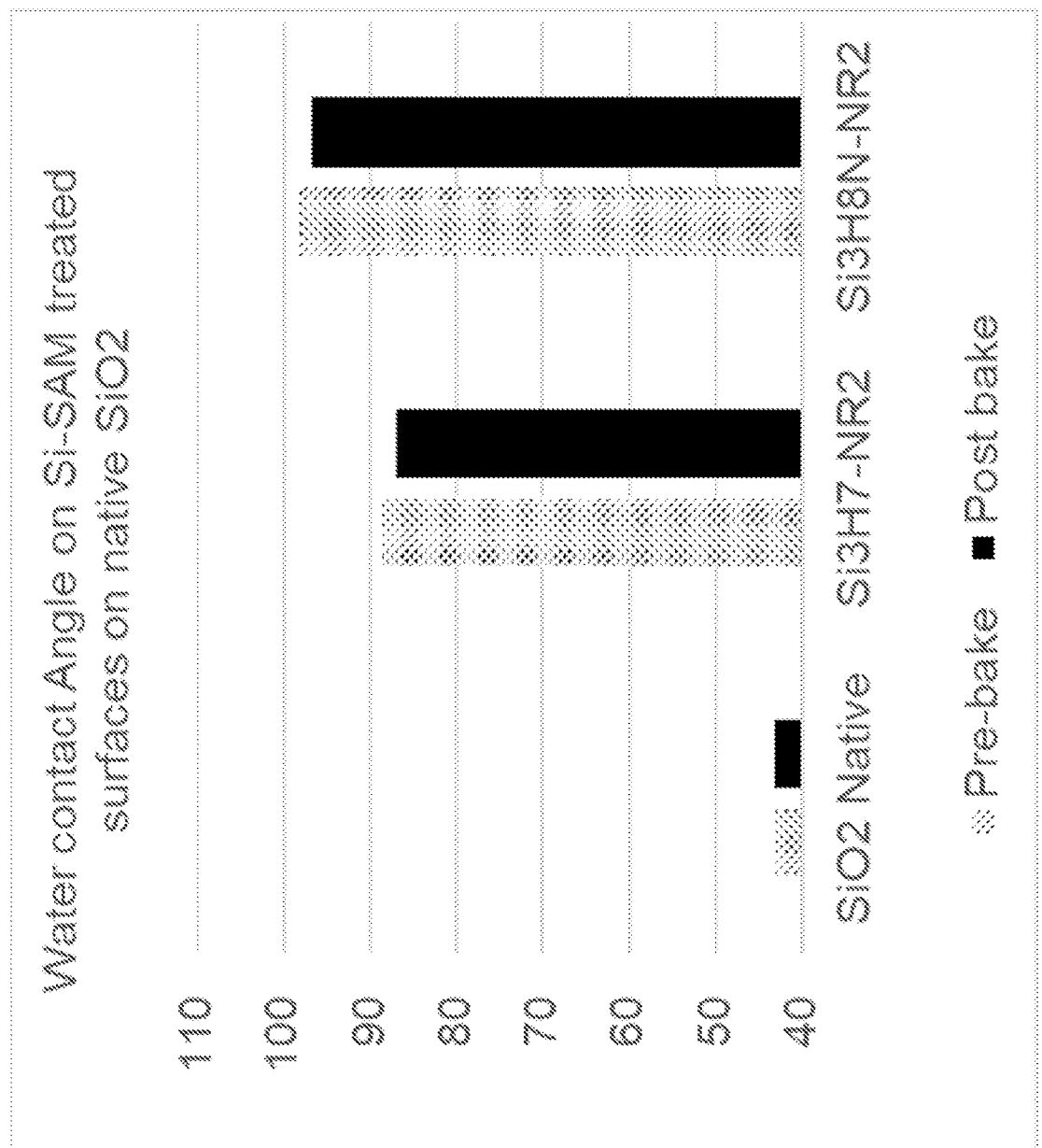
FIG. 3 is WCA results for the monoamino-trisilylamine derivative ($Si_3H_8N$—$NR_2$, wherein $R^1$ is a $C_2$ to $C_5$ alkyl)

The results are listed in FIG. 2 and FIG. 3 that indicate a clear increase of the WCA for both the mono-amino trisilane ($Si_3H_7$—$NR_2$, wherein $R^1$ is a $C_2$ to $C_5$ alkyl) derivative and the monoamino-trisilylamine derivative ($Si_3H_6N$—$NR_2$, wherein $R^1$ is a $C_2$ to $C_5$ alkyl). The WCA remains high after annealing at 300° C., which indicates that these SiT-SAM monomers may withstand such a high temperature without decomposition and that wet exposure at room temperature is sufficient to chemically bind these SAMs to the surface.

Example 12

Application of SiT SAM as a SOD Coating Primer Using (diisobutylamine)trisilane (DIBATS) as an Adhesion Promoter to Deposit a Polycarbosilazane Film Same process as described in comparative example 1 was performed using DIBATS as adhesion promoter instead of HDMS. A silicon wafer with native oxide, cut into coupons 2×2 cm, was cleaned for 10 min under UV—$O_3$ cleaning. Afterwards, the coupon was brought into a $N_2$ glovebox and 200 µl of DIBATS solution was spun onto it for 60 s at 2000 rpm using Brewer Science Cee 200× spin coater. After spinning the DIBATS adhesion promoter, the surface showed a hydrophobic character with an average contact angle of 88°. Afterwards, 200 µl polycarbosilazane solution was spun for 60 s at 2000 rpm. Spin-on process was followed by prebake step in the $N_2$ glovebox at 200° C. for 5 min to promote solvent and volatile evaporation.

Figure 4:
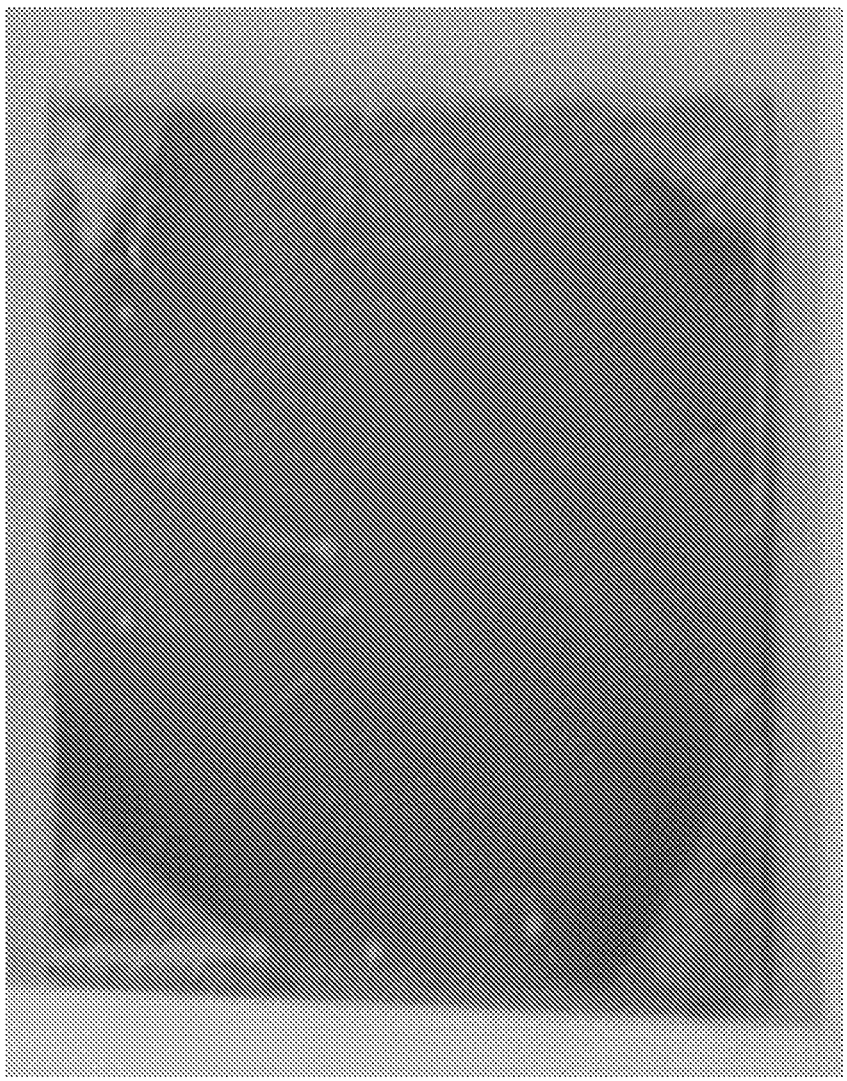
FIG. 4 is a spin-on deposition of thin film using (Di-isobutylamine)trisilane (DIBATS) as adhesion agent.

FIG. 4 shows a spin-on deposition thin film using DIBATS as adhesion agent. A film is retained and uniform across the coupons. After the prebake step, a polycarbosilizane thin film of 260 nm thick was retained. The film shows good uniformity across the film with few voids and defects. Thus, this example demonstrate that DIBATS is able to strongly bind with the polycarbosilazane and retain the bond after the prebake heating treatment. To test the adhesion of the polycarbosilazane to the silicon substrate a scotch tape test was performed. The thin film did not peel off or detach. No visual difference could be observed after multiple repetition (more than 5) of scotch tape test on the same coupon.

Example 13

Application of SiT SAM as a SOD Coating Primer Using (diisopropylamine)trisilylamine (TSA-N(CHMe$_2$)$_2$) as an Adhesion Promoter to Deposit a Polycarbosilazane Film Same process as described in Example 12 using DIBATS as adhesion promoter was performed using TSA-N(CHMe$_2$)$_2$ as adhesion promoter instead of DIBATS. A silicon wafer with native oxide, cut into coupons 2×2 cm, was cleaned for 10 min under UV—$O_3$ cleaning. Afterwards, the coupon was brought into a $N_2$ glovebox and 200 µl of TSA-N(CHMe$_2$)$_2$ solution was spun onto it for 60 s at 2000 rpm using Brewer Science Cee 200X spin coater. After spinning the TSA-N(CHMe$_2$)$_2$ adhesion promoter, the surface showed a hydrophobic character with an average contact angle of 98°. Afterwards, 200 µl polycarbosilazane solution was spun for 60 s at 2000 rpm. Spin-on process was followed by prebake step in the $N_2$ glovebox at 200° C. for 5 min to promote solvent and volatile evaporation.

Figure 5:
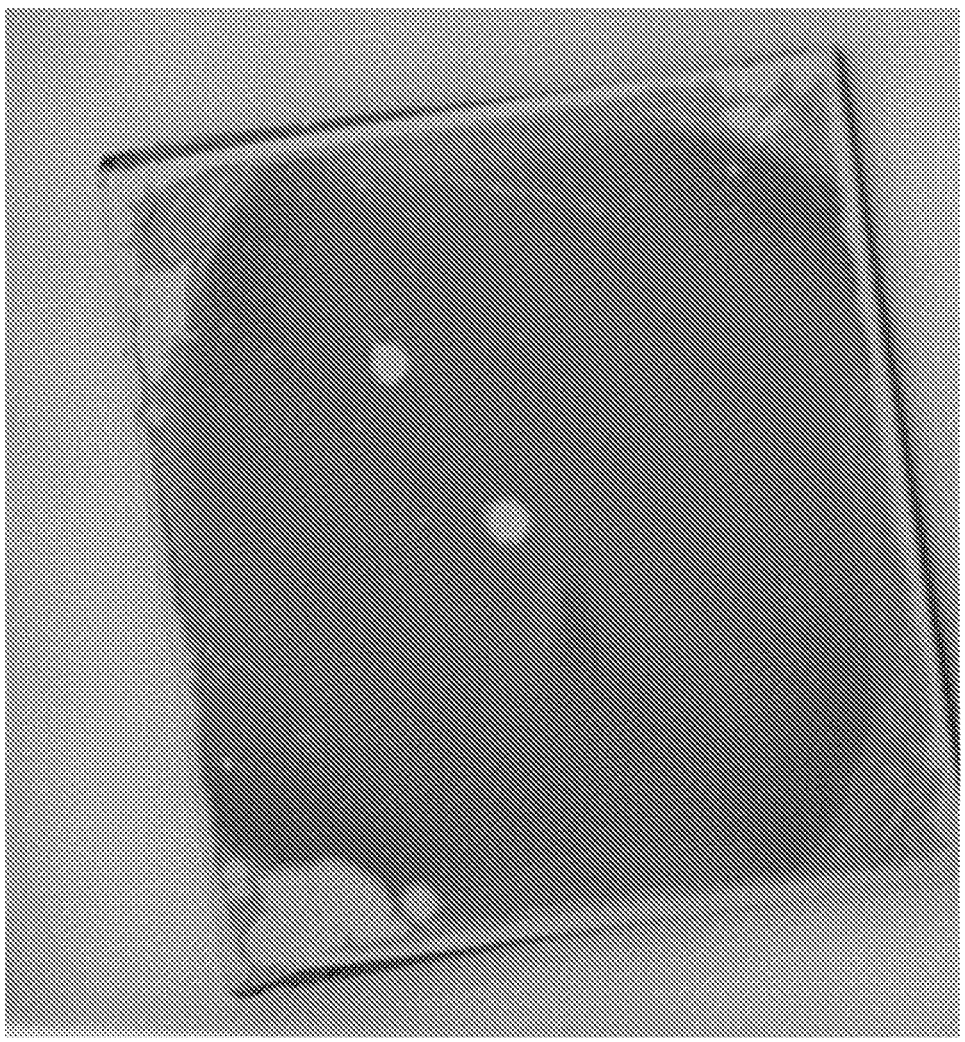
FIG. 5 is a spin-on deposition of thin film using (Diisopropylamine)trisilylamine as adhesion agent.

FIG. 5 shows a spin-on deposition thin film using TSA-NH(CHMe$_2$)$_2$ as adhesion agent. A film is retained and uniform across the coupons. After the prebake step, a polycarbosilazane thin film of 260 nm thick was retained. The film shows good uniformity across the film with few voids and defects. Thus, this example demonstrates that TSA-NH(CHMe$_2$)$_2$ is able to strongly bind with the polycarbosilazane and retain the bond after the prebake heating treatment. To test the adhesion of the polycarbosilazane to the silicon substrate a scotch tape test was performed. The thin film did not peel off or detach. No visual difference could be observed after multiple repetition (more than 5) of scotch tape test on the same coupon.

Example 14

Vapor Coating of SiT-SAMs $SiO_2$ (thermal oxide) wafers were exposed to SiT-SAM monomer DIBATS (0.02 Torr partial pressure) vapor under vacuum (9.5 T) at 100° C. The wafers were exposed to the SiT SAM vapor for 5 minutes. The wafers were either as received (native) or pretreated under $O_3$ (10 min, room temperature) to clean and hydroxylate the surface. Water contact angle (WCA) measurements were immediately measured in air. The wafers were stored at ambient temperatures (23-24° C.) and humidity (41-56% RH), and the WCA was re-measured after 24 hours and 48 hours aging.

Figure 6:
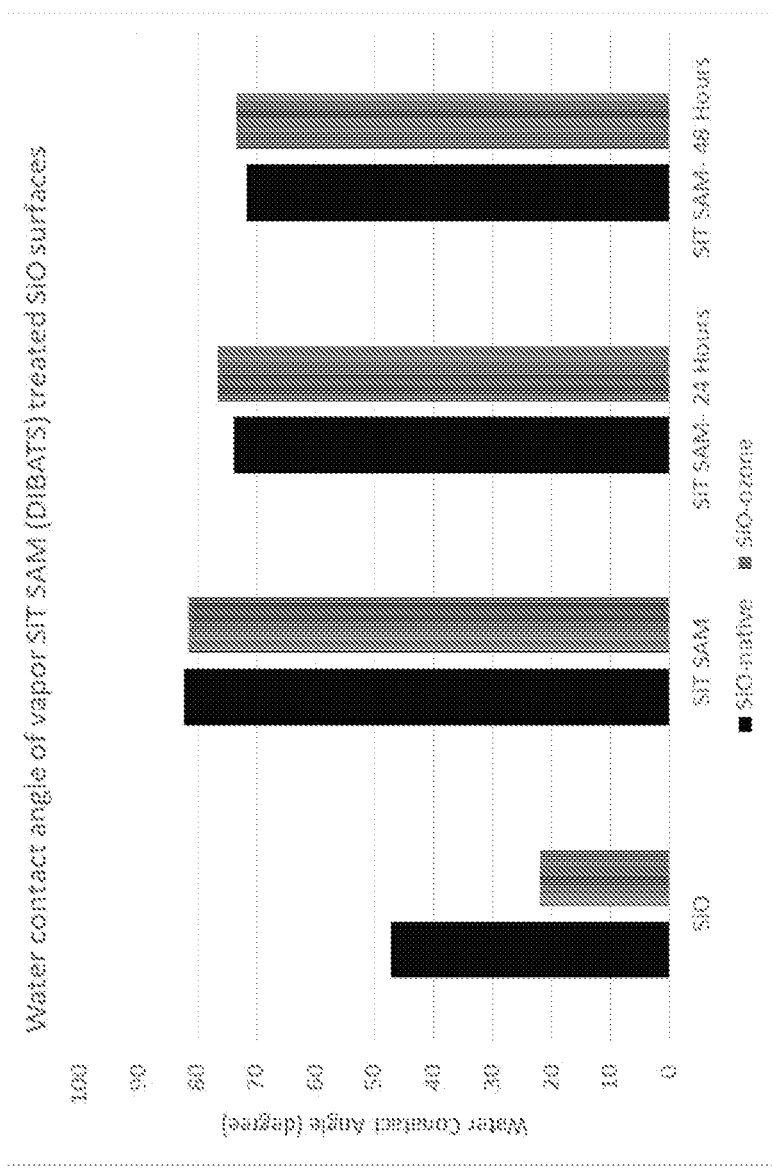
FIG. 6 is water contact angle (WCA) of vapor SiT SAM (DIBATS) treated SiO surface.

The results are listed in FIG. 6 that indicate a clear increase of the WCA for both the as native and pretreated SiO substrates exposed to the vapor SiT-SAM, DIBATS. The WCA remains high (>70 degrees) after aging at ambient conditions after 24 and 48 hours, which indicates that SiT-SAM monomers may be stable and withstand exposure at ambient conditions.

Prophetic Example 1

Dry Coating of SiT-SAMs

The disclosed SiT-SAM monomers used in a dry coating process are volatile enough to be evaporated and to reach a sufficient vapor pressure to react with the surface of a substrate/wafer within a reasonable time. The surface to be treated is exposed to and left to react with the vapors of the SiT-SAM monomers. CVD or ALD processes may be applied to dry coating of SiT-SAMs. The substrate/wafer is heated above room temperature but below the decomposition temperature of the SiT-SAM monomer on the surface to promote and accelerate the reaction and attachment of the SiT-SAM monomer to the surface. This reaction may be realized at atmospheric pressure (e.g., APCVD) or under vacuum.

Prophetic Example 2

Applications of SiT-SAMs as an Enhancement Layer for Thin Film Deposition

Example application for Si anodes in battery space may be done by comparisons of growing poly-Si on top of (Diisobutylamine)trisilane coated SiO vs non (Diisobutylamine)trisilane coated SiO (gas/liquid), and growing porous Si on top of (Diisobutylamine)trisilane coated Ni (with native oxide) O vs. non (Diisobutylamine)trisilane coated (gas/lid). The disclosed SiT-SAM monomers may be used as seed for metal barrier using metal halides (W, Mo, Ti, Ta . . . ) at temperatures below 600° C., preferably below 500° C.

Prophetic Example 3

Application of SiT-SAM for Powder Coating

Wet coating of powder/filtration/wet oxidation ($H_2O$+ IPA) to $SiO_2$ on surface of powder could be done with the disclosed SIT-SAM monomers. Gas phase coating of powders for Carbon-free hydrophobic properties enhancement, such as $Al_2O_3$, $SiO_2$ powders, Si powder with native oxide, any metallic powder with native or ALD oxide such as Al, W, Ti, Cu, could be done with the disclosed SiT-SAM monomers.

Although the subject matter described herein may be described in the context of illustrative implementations to process one or more computing application features/operations for a computing application having user-interactive components the subject matter is not limited to these particular embodiments. Rather, the techniques described herein may be applied to any suitable type of user-interactive component execution management methods, systems, platforms, and/or apparatus.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

What is claimed is:

1. A film-forming process, the process comprising the steps of:
   preparing a surface on a substrate for exposure of the surface to a self-assembling monolayer (SAM) forming composition, the composition comprising a SAM precursor having a backbone with a surface reactive group X,
   wherein the backbone contains no Si—C bonds and is selected from the group consisting of a Si—C-free polysilane and a trisilylamine,
   wherein the surface reactive group X is selected from:
      a halide selected from Cl, Br, I;
      a cyanate, an isocyanate or a thiocyanate group;
      an amino group —$NR^1R^2$, wherein $R^1$ is selected from H, a linear, branched or cyclic $C_1$-$C_{10}$ alkyl or alkenyl group or an alkyl silyl group; $R^2$ is selected from a linear, branched or cyclic $C_2$-$C_{10}$ alkyl or alkenyl group, provided that $R^1$=$R^2$≠Et; or an alkyl silyl group; or $R^1$ and $R^2$ are bridged so that $NR^1R^2$ forms a cyclic ligand, provided that the cyclic ligand includes heteroatoms S, N or O;
      an amidinate group —$R^3$—N—C($R^4$)=N—$R^5$, wherein $R^3$ and $R^5$ are each independently selected from a $C_1$ to $C_{10}$ linear or branched alkyl or a trialkylsilyl; and $R^4$ is selected from H, a $C_1$ to $C_{10}$ linear or branched alkyl; or
      a thiol —SH, a phosphonic acid or a carboxylic acid;
   exposing of the surface to the SAM forming composition;
   forming the SAM on the surface through a liquid or gas phase exposure; and
   growing a film on top of the SAM through a wet or dry deposition process using a film-forming precursor selected from a main group element, or a transition metal element selected from Ti, Ta, W, Mo, Nb, or V, a fluoride, a chloride, a bromide, an iodide, an oxychloride, an oxybromide, an oxyfluoride and combinations thereof.

2. The process of claim 1, wherein the film-forming precursor is selected from $WF_6$, $WOF_4$, $WOCl_4$, $WCl_6$, $WCl_5$, $MoCl_5$, $MoOCl_4$, $MoO_2Cl_2$, $TiCl_4$, $TiBr_4$, $TiI_4$, $TaCl_5$, $AlCl_3$, $VCl_4$, $NbCl_5$, $BCl_3$, $BBr_3$, $GeCl_4$, $GeBr_4$ or $GeCl_2$, $GeBr_2$ and combinations thereof.

3. The process of claim 1, wherein the dry deposition process is an ALD or CVD process.

4. The process of claim 1, wherein X is a dialkylamino group —$NR^1R^2$, wherein $R^1$ is H, a $C_2$ to $C_5$ alkyl, and $R^2$ is a $C_1$ to $C_5$ alkyl, provided that if $R^1$=H, $R^2$ is a $C_3$ to $C_5$ alkyl, and if $R^1$ not H, $R^1$ and $R^2$ are identical.

5. The process of claim 1, wherein the Si—C-free polysilane backbone of the SAM precursor is selected from —$SiH_2$—$SiH_3$ or —$SiH_2$—$SiH_2$—$SiH_3$.

6. The process of claim 1, wherein the SAM precursor having the Si—C-free polysilane backbone is selected from
   X—$(SiH_2)_n$—$SiH_3$, wherein n=1 to 3,
   X—$(Si_nH_{2n-1})$, wherein $Si_nH_{2n-1}$ refers to a cyclic hydridosilane backbone with n=5, 6, 7,
   X—$(SiH(SiH_3)_2)$, or
   X—$SiH_2$—$Si(SiH_3)_3$.

7. The process of claim 1, wherein the SAM precursor having the Si—C-free polysilane backbone is selected from $NiPr_2$—$(SiH_2)$—$SiH_3$, $NnBu_2$-$(SiH_2)$—$SiH_3$, $NfBu_2$-$(SiH_2)$—$SiH_3$, $NsBu_2$-$(SiH_2)$—$SiH_3$, N/$Bu_2$-$(SiH_2)$—$SiH_3$, $NPen_2$-$(SiH_2)$—$SiH_3$, $NnPr_2$—$(SiH_2)_2$—$SiH_3$, $NiPr_2$—$(SiH_2)_2$—$SiH_3$, $NnBu_2$-$(SiH_2)_2$—$SiH_3$, $NtBu_2$-$(SiH_2)_2$—$SiH_3$, $NsBu_2$-$(SiH_2)_2$—$SiH_3$, $NiBu_2$-$(SiH_2)_2$-$SiH_3$, $NsPen_2$-$(SiH_2)_2$—$SiH_3$, NHtBu-$(SiH_2)_2$—$SiH_3$, NHPen-$(SiH_2)_2$—$SiH_3$, NHsBu-$(SiH_2)_2$—$SiH_3$, NHiBu-$(SiH_2)_2$—$SiH_3$, $NnPr_2$—$(SiH_2)_3$—$SiH_3$, N/$Pr_2$—$(SiH_2)_3$—$SiH_3$, $NnBu_2$-$(SiH_2)_3$—$SiH_3$, $NtBu_2$-$(SiH_2)_3$—$SiH_3$, $NsBu_2$-$(SiH_2)_3$—$SiH_3$, $NiBu_2$-$(SiH_2)_3$—$SiH_3$, $NsPen_2$-$(SiH_2)_3$—$SiH_3$, $NEt_2$-$(SiH(SiH_3)_2)$, $NiPr_2$—$(SiH(SiH_3)_2)$, $NnPr_2$—$(SiH(SiH_3)_2)$, $NiBu_2$-$(SiH(SiH_3)_2)$, $NtBu_2$-$(SiH(SiH_3)_2)$, $NnBu_2$-$(SiH(SiH_3)_2)$, $NsBu_2$-$(SiH(SiH_3)_2)$, $NsPen_2$-$(SiH(SiH_3)_2)$, NHtBu-$(SiH(SiH_3)_2)$, NHnBu-$(SiH(SiH_3)_2)$, NH/Bu-$(SiH(SiH_3)_2)$, or NHPen-$(SiH(SiH_3)_2)$.

8. The process of claim 1, wherein the SAM precursor having the trisilylamine backbone contains more than one N(—Si)$_3$ units and has backbones of $(Si)_2$N—Si—N(Si)(Si—X) or X—Si—N(Si)—Si—N(Si)(Si—X).

9. The process of claim 1, wherein the SAM precursor is (Diisopropylamine)trisilylamine (($CMe_2$)$_2$-N—$SiH_2$—N—$(SiH_3)_2$, TSA-N($CMe_2$)$_2$).

10. The process of claim 1, wherein the SAM precursor is Chlorotrisilylamine $(SiH_3)_2$—N—$SiH_2Cl$, TSA-Cl).

11. The process of claim 1, wherein the SAM precursor is bi-disilylaminohalogensilane (BDSASi-X), wherein X=F, Cl, Br or I.

12. The process of claim 1, wherein the SAM precursor is Diisobutylamine)trisilane (DIBATS, $(iBu)_2$-N—$SiH_2$—$SiH_2$—$SiH_3$).

* * * * *